United States Patent
Quan

(10) Patent No.: US 10,216,205 B2
(45) Date of Patent: Feb. 26, 2019

(54) LOW VOLTAGE TUBE CIRCUITS

(71) Applicant: Ronald Quan, Cupertino, CA (US)

(72) Inventor: Ronald Quan, Cupertino, CA (US)

(*) Notice: Subject to any disclaimer, the term of this patent is extended or adjusted under 35 U.S.C. 154(b) by 0 days.

(21) Appl. No.: 15/161,183

(22) Filed: May 20, 2016

(65) Prior Publication Data

US 2017/0329359 A1 Nov. 16, 2017

Related U.S. Application Data

(60) Provisional application No. 62/175,285, filed on Jun. 14, 2015, provisional application No. 62/175,246, filed on Jun. 13, 2015.

(51) Int. Cl.

| | |
|---|---|
| *H03F 3/00* | (2006.01) |
| *G05F 1/42* | (2006.01) |
| *H01J 23/34* | (2006.01) |
| *H01H 47/02* | (2006.01) |
| *H01J 23/40* | (2006.01) |
| *H01J 23/14* | (2006.01) |
| *H01R 9/24* | (2006.01) |
| *H03F 1/32* | (2006.01) |
| *H01J 5/02* | (2006.01) |
| *H03F 3/02* | (2006.01) |
| *H03F 1/33* | (2006.01) |

(52) U.S. Cl.
CPC .............. *G05F 1/42* (2013.01); *H01H 47/02* (2013.01); *H01J 5/02* (2013.01); *H01J 23/14* (2013.01); *H01J 23/34* (2013.01); *H01J 23/40* (2013.01); *H01R 9/2483* (2013.01); *H03F 1/3252* (2013.01); *H03F 1/33* (2013.01); *H03F 3/02* (2013.01)

(58) Field of Classification Search
CPC ................. H03F 1/04; H03F 1/30; G05F 1/42
USPC ...................................... 330/127, 70, 120, 3
See application file for complete search history.

(56) References Cited

U.S. PATENT DOCUMENTS

| | | | |
|---|---|---|---|
| 2,538,488 A * | 1/1951 | Volkers | ...................... H03F 3/36 330/111 |
| 2,881,355 A | 4/1959 | Winter | |
| 5,022,305 A | 6/1991 | Butler | |
| 6,737,915 B1 | 5/2004 | Harner | |
| 7,053,710 B2 | 5/2006 | Mieda | |
| 7,397,303 B2 | 7/2008 | Mieda | |
| 8,542,848 B1 * | 9/2013 | Krutsick | ................ G10H 3/187 330/127 |

OTHER PUBLICATIONS

RCA Receiving Tube Manual, 1968, RC-26, Radio Corporation of America, Harrison, NJ, USA. pp. 507 to 517.

* cited by examiner

*Primary Examiner* — Khanh V Nguyen
*Assistant Examiner* — Khiem D Nguyen

(57) ABSTRACT

A number of low voltage vacuum tube circuits include using supply voltages well below the manufacturer's recommended voltages applied to the plate or screen grid. Some of the tube circuits operate at near zero plate and or screen grid voltages. Other low voltage circuits have forward biasing on one or more grids that are normally biased at a non positive voltage or a grid that is normally connected a cathode. Substantially lower supply voltages allow for example, the filament supply to also supply voltage to the plate and or grid for providing an output signal at a grid and or a plate.

14 Claims, 23 Drawing Sheets

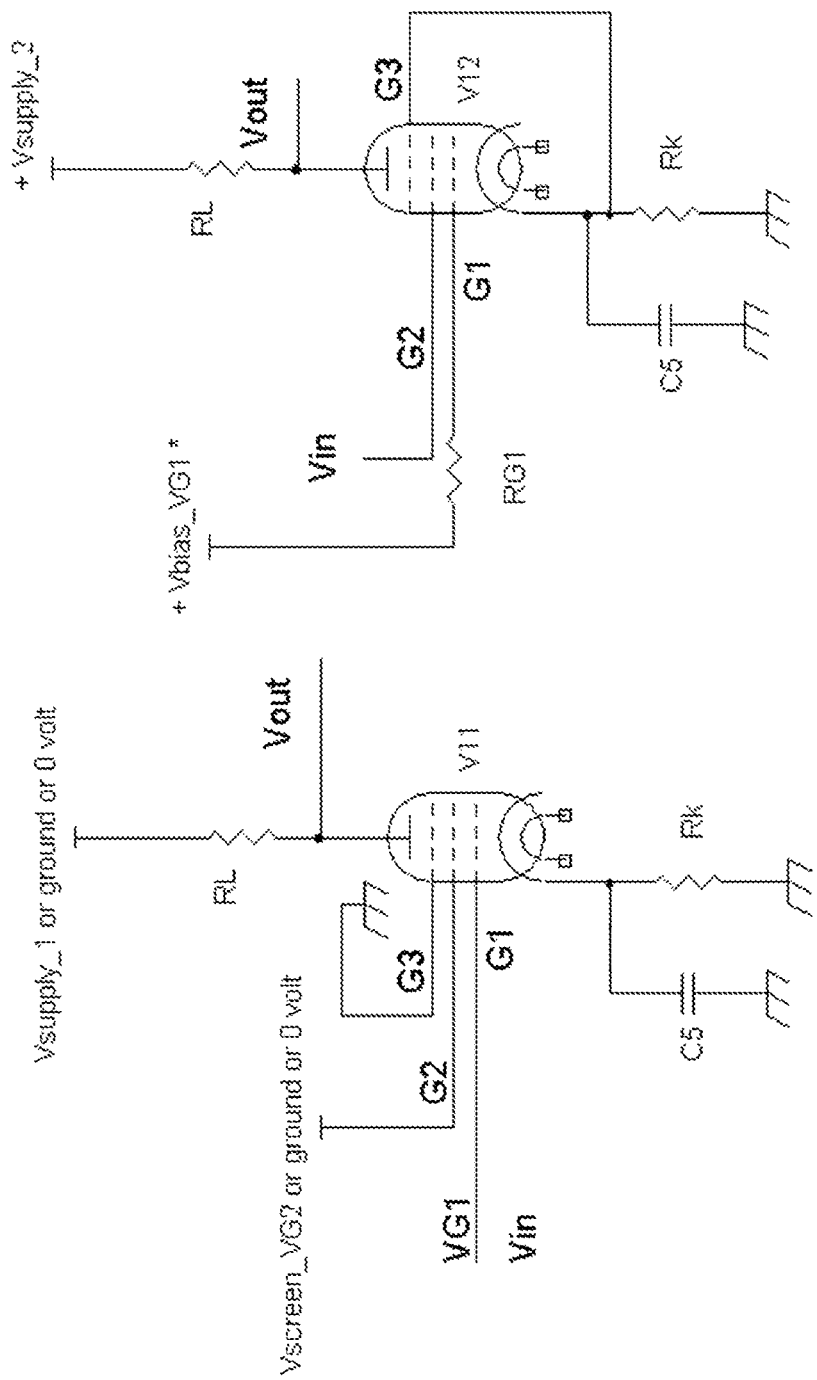

LOW VOLTAGE TUBE CIRCUITS

This application claims priority to U.S. provisional Ser. No. 62/175,246 filed on Jun. 13, 2015, and to U.S. provisional Ser. No. 62/175,285 filed on Jun. 14, 2015, which both are incorporated herein by reference.

BACKGROUND

The present invention relates to operating vacuum tubes at lower than the normally specified plate or screen grid voltages.

Specially made tubes (e.g., including low voltage space charge tubes that operates at about 12 volts on the plates and or screen grid or space charge grid) such as those manufactured for automobiles in the 1950s allowed for low plate voltages. However, conventionally manufactured vacuum tubes require high voltages. The specification data sheets of these types of tubes generally require high voltages applied to the plates and or screen grids.

SUMMARY

In one embodiment of the invention, it was found experimentally and unexpectedly that some vacuum tubes are able to output a signal with very low plate or screen grid voltages. For example, a plate voltage was provided in a zero volt range (e.g., plate voltage between −1 volt and +1 volt, or a plate to cathode or filament voltage in the range of −1 volt and +1 volt) in a conventional multi-grid tube or pentode or triode provided signal via a load element, such as a load resistor, inductor, transformer, active load, and or the like. Normally vacuum tubes that are designed for high voltages (e.g., plate and or screen voltages at least 50 volts) show signal output (or amplification) when operating at plate and or screen voltages as low as zero volts. For example the signal input may be coupled to a first grid and the output via a load resistor tied to a supply voltage that may include (e.g., around) zero volt (e.g., may include a plate and or grid grounded and or tied to a supply voltage). The load element (e.g., resistor, network, circuit, impedance component) outputs a signal.

One or more embodiments may include the following:

1) A triode with a load resistor or element coupled to the plate and a power supply, wherein the power supply may provide a positive voltage or a voltage as low as zero volts or a negative voltage (e.g., plate voltage with respect to cathode or filament, or wherein the cathode is coupled to ground, to an input signal, or to a positive voltage). Signal is coupled to a grid of the triode and an output signal is provided at the plate.

2) A multiple grid tube is configured as a triode with a load resistor or element coupled to the plate or a second grid and to a power supply. Wherein the power supply may provide a positive voltage or a voltage as low as zero volts or a negative voltage (e.g., plate voltage with respect to cathode or filament, or wherein the cathode is coupled to ground or to a positive voltage). Signal is coupled to a first grid (or to a cathode) of the multiple grid tube and an output signal is provided at the plate or the second grid.

3) A tetrode or pentode or multiple grid tube (e.g., a tube with two, three, four, five, six, or at least seven grids) with a load resistor or element coupled to the plate and a power supply, wherein the power supply may provide a positive voltage or a voltage as low as zero volts or a negative voltage (e.g., plate voltage with respect to cathode or filament, or wherein the cathode is coupled to ground or to a positive voltage). Signal is coupled to a first grid (or to a cathode) of the tetrode or pentode or multiple grid tube and an output signal is provided at the plate. A second grid or screen grid may be left open, coupled to the plate, coupled to a power supply, and or coupled to a voltage that is near or at ground or 0 volt. Near 0 volt may include a positive or negative voltage. Near 0 volt may include zero volt or substantially zero volt, or approximately zero volt.

4) A tetrode or pentode or multiple grid tube (e.g., a tube with two, three, four, five, six, or at least seven grids) with a load resistor or element coupled to the plate or a second grid and a power supply, wherein the power supply may provide a positive voltage or a voltage as low as zero volts or a negative voltage (e.g., plate voltage with respect to cathode or filament, or wherein the cathode is coupled to ground, a signal source, or to a positive voltage). Signal is coupled to a first grid (or to a cathode) of the tetrode or pentode or multiple grid tube and an output signal is provided at the plate. The plate may be left open, coupled to a power supply, and or coupled to a voltage that is near or at ground or 0 volt. Near 0 volt may include a positive or negative voltage. Near 0 volt may include zero volt or substantially zero volt, or approximately zero volt.

5) A tetrode or pentode or multiple grid tube (e.g., a tube with two, three, four, five, six, or at least seven grids) with a load resistor or element coupled to the plate and a power supply, wherein the power supply may provide a positive voltage or a voltage as low as zero volts or a negative voltage (e.g., plate voltage with respect to cathode or filament, or wherein the cathode is coupled to a ground, a signal source, or to a positive voltage). Signal is coupled to a first grid (or to a cathode) of the tetrode or pentode or multiple grid tube and an output signal is provided at the plate. A second grid or screen grid may be left open, coupled to the plate, coupled to a power supply, and or coupled to a voltage that is near or at ground or 0 volt. Near 0 volt may include a positive or negative voltage. Near 0 volt may include zero volt or substantially zero volt, or approximately zero volt.

6) A tetrode or pentode or multiple grid tube (e.g., a tube with two, three, four, five, six, or at least seven grids) with a load resistor or element coupled to the plate and a power supply, wherein the power supply may provide a positive voltage or a voltage as low as zero volts or a negative voltage (e.g., plate voltage with respect to cathode or filament, or wherein the cathode is coupled to a ground, a signal source, or to a positive or negative voltage). Signal is coupled to a first grid (or to a cathode) of the tetrode or pentode or multiple grid tube and an output signal is provided at the plate. A second grid or screen grid may be left open, coupled to the plate, coupled to a power supply, and or coupled to a voltage that is near or at ground or 0 volt. Near 0 volt may include a positive or negative voltage. A power supply voltage is coupled to a second grid or a screen grid that results in having the output signal change phase. For example, when the power supply voltage is at zero or near zero for the plate and screen grid supplies, the output signal at the plate is 180 degrees phase shifted (e.g., as expected for a common cathode amplifier) from the input signal at a control grid. With the plate supply at zero or near zero volt, and the screen grid or second grid voltage is increased in a positive direction such as to around 4 volts (e.g., in a 12AC6 tube), the resulting output signal at the plate is substantially in phase with the control grid signal, which is unexpected (e.g., when the cathode is coupled to ground or a positive voltage).

For the previously stated 1 through 6, the plate does not need to be coupled to a plate or load resistor or element. Instead the plate current can be coupled to a load different from a resistor. For example, the load may be another amplifier, a transimpedance amplifier, or some other device (e.g., active load, inductor, element, transformer, capacitor, amplifier, circuit, and or solid state device). The plate voltage may be coupled or held to any of the plate voltages mentioned in 1 through 6 (e.g., above). Note for the previously stated 1 through 6 other voltage ranges may be included or used, and or other load resistors and or elements may be included or used.

For the previously stated 1 through 6, the cathode may be coupled to ground, a signal source, or to a positive voltage. For example, coupling (e.g., to the cathode) may include a resistor, inductor, capacitor, active current source, active load, amplifier, circuit, or a signal source, or a voltage or current source.

For the previously stated 1 through 6, an output may be from a grid, plate, and or cathode.

An example summary of certain experiments (e.g., an amplifier or common cathode amplifier) is shown in Tables A, B, or C below. Input voltage to a first grid or a control grid is an AC voltage at 0.200 volt peak to peak. Note that other AC voltages in terms of amplitude may be used that are coupled to the first grid or the control grid.

The low voltage tube circuits or any embodiments may include use for amplifiers, mixers, multipliers, sound effects (e.g., musical sound effects such as for guitar, fuzz, pedal, or electronic sound effects), adders, subtractors, and or feedback circuits. For example, one or more signals may be coupled to a low voltage tube circuit at one or more elements of the tube (e.g., signal coupled to a grid and or another grid and or cathode).

One embodiment may include enabling conventional high voltage tubes to operate at lower voltages by (e.g., forward) biasing (e.g., via a positive voltage with respect to the cathode) a first grid closest to the cathode (e.g., cathode or filament) and coupling signal to a subsequent grid such as a second or a third grid (e.g., a signal grid) that is further away from the first grid (e.g., wherein the cathode, heater, or filament is defined as a center reference). A load element is coupled to a supply from 0 volts to a lower than normal (e.g., positive) voltage supply to a plate or to one or more grids beyond (or before) the signal grid. Note that the voltage at the first grid may be a static or time vary voltage. For example, a positive DC voltage into the first grid with respect to the cathode may be static or may be varied as to provide a voltage controlled gain amplifier. In another example, the first grid's voltage may be time varying to provide a mixing, multiplying, or modulation effect on the signal coupled to the subsequent grid.

Any embodiment may include directly or indirectly heated cathodes for a vacuum tube. For example, a directly heated tube has a filament, or an indirectly heated cathode generally includes a filament and a sleeve encasing the filament, wherein the sleeved portion provides a cathode connection terminal.

Tables A, B, and or C show examples where low, zero, or close to zero voltage provided to the plate or plate supply or grid supply will allow for (e.g., usable) output signals.

TABLE A

| TUBE | PLATE SUPPLY VOLTAGE OR $V_p$ IN VOLT | SECOND OR SCREEN GRID SUPPLY VOLTAGE | VOUT, OR OUTPUT SIGNAL VOLTAGE PEAK TO PEAK | PLATE LOAD RESISTOR OR RL | COMMENTS | DISTORTION $HD_2$, $HD_3$ |
|---|---|---|---|---|---|---|
| 6BA6 RCA** | 47 V | 0.00 V | 6.15 V | 100 KΩ | | |
| 6BA6 RCA** | 6.2 V | 0.00 V | 2.17 V | 100 KΩ | CLIPPING | |
| 6BA6 RCA** | 2.5 V | 0.00 V | 0.37 V | 100 KΩ | CLIPPING | |
| 6BA6 RCA** | 0.87 V | 0.00 V | 0.061 V | 100 KΩ | NO CLIPPING | |
| 6BA6 RCA** | 0.00 V | 0.00 V | 0.006 V | 100 KΩ | NO CLIPPING | |
| 6BA6 RCA** | 0.00 V | 0.00 V | 0.019 V | ~1 MΩ | NO CLIPPING | |
| 6AU6** GE #1 | 0.00 V | 0.00 V | NO OUTPUT | ~1 MΩ | | |

TABLE A-continued

| TUBE | PLATE SUPPLY VOLTAGE OR $V_p$ IN VOLT | SECOND OR SCREEN GRID SUPPLY VOLTAGE | VOUT, OR OUTPUT SIGNAL VOLTAGE PEAK TO PEAK | PLATE LOAD RESISTOR OR RL | COMMENTS | DISTORTION $HD_2, HD_3$ |
|---|---|---|---|---|---|---|
| 6AU6** MAGNAVOX | 0.00 V | 0.00 V | 0.046 V | ~1 MΩ | CLIPPING | $HD_2 = 10\%$, $HD_3 = 3.6\%$ |
| 6AU6** | 0.00 V | 0.00 V | 0.004 V | ~1 MΩ | | DISTORTED |
| 6AU6** GE #2 | 0.00 V | 0.00 V | 0.264 V | ~1 MΩ | | $HD_2 = 30\%$, $HD_3 = 7.0\%$ |
| 6AU6** GE #3 | 0.00 V | 0.00 V | 0.184 V | ~1 MΩ | | $HD_2 = 30\%$, $HD_3 = 10.0\%$ |
| 6BA6/5749 GE** | 0.00 V | 0.00 V | 0.070 V | ~1 MΩ | | $HD_2 = 5\%$, $HD_3 = 0.30\%$ |
| 6BA6/5749 GE** | 0.00 V | 2.00 V | 0.131 V | ~1 MΩ | | $HD_2 = 3\%$, $HD_3 = 0.36\%$ |
| 6AU6 **GE #2 | 0.00 V | 0.00 V | 0.360 V | ~1 MΩ | RETESTED WITH SCREEN GRID TIED TO PLATE (E.G., TRIODE) | $HD_2 = 5\%$, $HD_3 = 3.0\%$ |

\* = low voltage tube
\*\*= high voltage tube

Table B is below.

TABLE B

| TUBE | PLATE SUPPLY VOLTAGE OR $V_p$ IN VOLT | SECOND OR SCREEN GRID SUPPLY VOLTAGE | VOUT, OR OUTPUT SIGNAL VOLTAGE PEAK TO PEAK | LOAD RESISTOR | COMMENTS | DISTORTION $HD_2, HD_3$ |
|---|---|---|---|---|---|---|
| 6AU6** GE #2 | NOT APPLICABLE, SEE COMMENTS | 0.00 V | 0.360 V | ~1 MΩ | RETESTED WITH LOAD RESISTOR TO SCREEN GRID. PLATE IS DISCONNECTED AND IS OPEN CIRCUIT AND FLOATING | $HD_2 = 5\%$, $HD_3 = 3.0\%$ |
| 6AU6** GE #2 | 0.00 V | 0.00 V | 0.544 V | ~1 MΩ | RETESTED WITH LOAD RESISTOR TO SCREEN GRID. PLATE IS DISCONNECTED AND IS CONNECTED TO GROUND (E.G., 0 VOLT) | |
| 6AU6** GE #2 | 47 V | 0.00 V | 0.590 V | ~1 MΩ | RETESTED WITH LOAD RESISTOR TO SCREEN GRID. PLATE IS DISCONNECTED AND CONNECTED TO A PLATE | |

TABLE B-continued

| TUBE | PLATE SUPPLY VOLTAGE OR $V_p$ IN VOLT | SECOND OR SCREEN GRID SUPPLY VOLTAGE | VOUT, OR OUTPUT SIGNAL VOLTAGE PEAK TO PEAK | LOAD RESISTOR | COMMENTS | DISTORTION $HD_2, HD_3$ |
|---|---|---|---|---|---|---|
| | | | | | SUPPLY (E.G., 47 VOLTS) | |

\* = low voltage tube
\*\*= high voltage tube

Table C is below.

TABLE C

| TUBE | PLATE SUPPLY VOLTAGE OR $V_p$ IN VOLT | SECOND OR SCREEN GRID SUPPLY VOLTAGE | VOUT, OR OUTPUT SIGNAL VOLTAGE PEAK TO PEAK | PLATE LOAD RESISTOR OR RL | COMMENTS | DISTORTION $HD_2, HD_3$ OR OTHER COMMENTS |
|---|---|---|---|---|---|---|
| 6AU6\*\* SYLVANIA | 0.00 V | 3.16 V | 0.230 V | ~1 MΩ | OUTPUT SIGNAL PEAKS AT ABOUT 3.16 VOLTS DC FOR SCREEN GRID OR SECOND GRID, OTHER VOLTAGES ABOVE OR BELOW 3.16 VOLTS RESULTS IN LOWER OUTPUT SIGNAL | $HD_2$ = 2%, $HD_3$ = 3.6% NOTE THAT THERE IS MORE THIRD ORDER DISTORTION THAN SECOND ORDER. UNUSUAL FOR A COMMON CATHODE AMPLIFIER. |
| 12AC6\* WESTINGHOUSE | 0.00 V | 0.00 V | 0.0085 V | ~1 MΩ | OUTPUT SIGNAL IS INVERTED AS EXPECTED FOR A COMMON CATHODE AMPLIFIER | |
| 12AC6\* WESTINGHOUSE, | 0.00 V | 4.12 V NOTE: THE INCREASE IN SCREEN OR $2^{ND}$ GRID VOLTAGE CAUSED A PHASE REVERSAL AT OUTPUT. | 0.0075 V | ~1 MΩ | OUTPUT SIGNAL IS NON-INVERTED AND IS UNEXPECTED FOR A COMMON CATHODE AMPLIFIER | ADJUSTING THE SCREEN GRID OR $2^{ND}$ GRID VOLTAGE FROM 0 TO +5 VOLTS CHANGED GAIN AND OR PHASE AT OUTPUT. |
| 12K5\* RCA | 0.00 V | 23.0 V | 0.0045 | ~1 MΩ | | $HD_2$ = 3% |

\*= low voltage tube
\*\*= high voltage tube

Note in Table C, tubes 12AC6 and 12K5 are special low voltage tubes designed to operate at 12 volts for the plates. Other tubes listed in Tables A, B, and or C are conventional tubes designed to operate at higher voltages (e.g., 100 volts or more).

A 12DZ6 low voltage tube had similar results as a 12AC6 (e.g., as shown in Table C).

Certain (e.g., conventional, high voltage, and or low voltage) tubes do work with (e.g., approximately, close to, or at) 0 volt plate and or screen grid voltage.

Also, one or more tubes provide low distortion or higher distortion signal output. The high distortion signals can be used for predistortion, sound effects, and or musical distortion effects (e.g., for a guitar, electric or acoustic, or for a musical instrument).

Of course, other conventional and or low voltage tubes can operate at close to or at zero volts for the plate and or screen or second grid.

In a certain configuration using a pentode or a tube with 3 or more grids, the third grid may or may not be grounded or coupled to a voltage source. However, it (e.g., a third grid)

can be connected in any manner. For example, such as connected to any of other the other grids or plate, connected to the cathode, connected as an open circuit, and or connected to a voltage source. The voltage source can include a signal source, and or a voltage source including a negative or positive voltage or a zero voltage.

Embodiments, circuits, and or experiments may include using single grid, multi-grid, or pentagrid or hexagrid tubes where the load resistor (or element) or output current may be connected to any combination of one or more grid(s) and or plate. Low supply voltages (e.g., positive or negative or zero volt) may be connected to any combination of one or more grid(s) and or plate.

Embodiments include the following:

A) Operating "high voltage" or conventional (e.g., non-low voltage automobile tubes or specifically designed low voltage tubes), at lower than normal plate voltages (e.g., <100 volts)

B) Using a combination of high and low voltage tubes operating at low plate voltages to provide amplification to provide a signal output.

C) Providing cascaded and or cascode circuits operating at low plate voltages.

D) Providing low noise performance for pre-amplification using low plate voltages.

E) Providing (e.g., line level or low level, or high level) amplification, or signal output using low plate voltages (e.g., with conventional tubes and or low voltage tubes).

F) Operating vacuum tubes at nearly zero volts (or zero volts) on the plate (e.g., ~0 volts from plate to cathode while providing an AC signal output at the plate).

G) Using other grid(s) as output terminal(s) while operating at nearly zero volts (or zero volts).

H) Forward biasing conventional high voltage tube(s) on a control grid to provide operating at a lower plate voltage for outputting an AC signal.

I) Forward biasing conventional high voltage tube(s) on a control grid and one other grid to provide operating with a lower plate voltage for outputting an AC signal.

J) Forward biasing conventional high voltage tube(s) on a control grid or a second grid to provide operating at a lower plate or third grid voltage for outputting an AC signal.

BRIEF DESCRIPTION OF THE DRAWINGS

FIG. 21A shows an example a very low voltage tube circuit.
FIG. 21B shows another example low voltage tube circuit.

DETAILED DESCRIPTION

In the following example circuits including FIGS. 1, 2, 3, 4, 5, 6, 7, 8, 9, 10, 11, 12, 13, 14, 15, 16, 17, 18, 19, 20, 21A, 21B, 22A, 22B, 23A, 23B, 23C, and or 23D other values for resistors, capacitors, and or voltages may be used and or other type tubes may be used. For Tables A, B, C, 1, 2, 3, 4, 5, 6, 7, and or 8 other tubes, component values, voltages, and or currents (e.g., plate current and or grid current) may be used. One or more embodiment(s) provide at least one improvement to tube amplifiers.

Note that Fig.=Figure. That is, the abbreviation, "Fig.", is interchangeable with the word, "Figure" (e.g., when referring to drawings). Also TABLE=Table.

When it comes to maximum gain and widest voltage swings for a given power supply, pentodes have distinct advantages over triodes.

For example, a low voltage triode such as the 12AE6, which looks like a 12AV6 tube, has a mu of only 15. This tube has a combination of low transconductance at 1 mmho and low plate resistance of 15KΩ.

In contrast, a 12EZ6 low voltage pentode has a transconductance of 2.7 mmho and a plate resistance of 400KΩ. The equivalent mu is the transconductance, $g_m$, multiplied by the plate resistance, $R_p$. Thus, for a 12EZ6, $g_m \times R_p$=2.7 mmho× 400KΩ=1080=mu.

Figure 1:
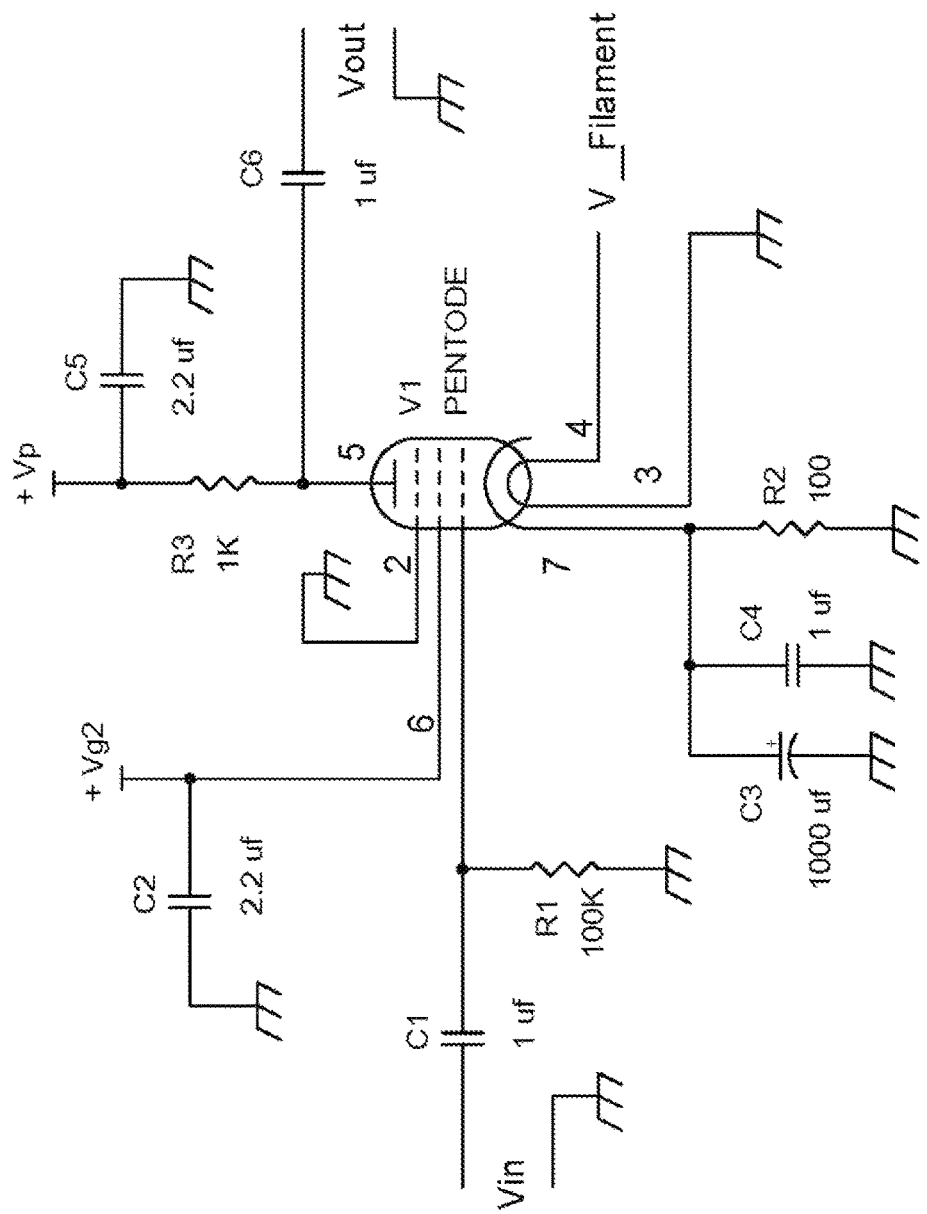
FIG. 1 shows a common cathode circuit.

FIG. 1 shows a circuit with plate supply voltages, 12 volts to 45 volts along with screen grid voltages from 6 volts to 24 volts. The plate load resistance is 1KΩ to allow for easy calculation of the transconductance, $g_m$. Vin=0.1 volt peak to peak AC signal at 1 kHz (e.g., other frequencies may be used).

$V_p$=Supply voltage in volts (v)

$I_p$=Plate current in milliamps (mA)

$V_{g2}$=Grid 2 or screen grid voltage

Vout=Output AC signal voltage in volts peak to peak (p-p).

$g_m$=transconductance in milli-mhos (mmho) or mS. Note: 1 mmho=1 mS $HD_2$=Second harmonic distortion in percent $HD_3$=Third harmonic distortion in percent Table 1 shows a summary of the tests.

TABLE 1

Summary of various pentodes

| TUBE | $V_p$ (v) | $I_p$ (mA) | $V_{g2}$ (v) | Vout p-p | $g_m$ (mS) | $HD_2$ (%) | $HD_3$ (%) |
|---|---|---|---|---|---|---|---|
| 12AC6* | 12 | 0.83 | 12 | 0.100 | 1.00 | 0.800 | 0.080 |
| 12AC6* | 12 | 1.87 | 24 | 0.110 | 1.10 | 0.055 | 0.071 |
| 12AC6* | 24 | 4.30 | 47 | 0.135 | 1.35 | 0.036 | 0.071 |
| 12AC6* | 45 | 2.11 | 24 | 0.145 | 1.45 | 0.360 | 0.030 |
| 12AF6* | 24 | 3.4 | 24 | 0.256 | 2.56 | 0.600 | 0.030 |
| 12AF6* | 24 | 6.74 | 47 | 0.223 | 2.23 | 0.800 | 0.030 |
| 12AF6* | 45 | 3.5 | 24 | 0.266 | 2.66 | 0.800 | 0.030 |
| 12AU6** | 45 | 0.50 | 24 | 0.152 | 1.52 | 2.700 | 0.071 |
| 12AU6** | 45 | 1.5 | 47 | 0.254 | 2.54 | 0.700 | 0.080 |
| 12BA6** | 45 | 0.25 | 6.0 | 0.078 | 0.78 | 3.600 | 0.015 |
| 12BA6** | 45 | 0.50 | 10.6 | 0.116 | 1.16 | 3.000 | 0.024 |
| 12BA6** | 45 | 1.60 | 24 | 0.226 | 2.26 | 1.500 | 0.050 |
| 12BA6** | 45 | 3.77 | 47 | 0.296 | 2.96 | 0.800 | 0.050 |
| 12DZ6* | 45 | 8.67 | 24 | 0.530 | 5.30 | 0.800 | 0.036 |

TABLE 1-continued

Summary of various pentodes

| TUBE | $V_p$ (v) | $I_p$ (mA) | $V_{g2}$ (v) | Vout p-p | $g_m$ (mS) | HD$_2$ (%) | HD$_3$ (%) |
|---|---|---|---|---|---|---|---|
| 12EK6* | 45 | 7.27 | 24 | 0.474 | 4.74 | 0.450 | 0.019 |
| 12EZ6* | 45 | 4.87 | 24 | 0.442 | 4.42 | 1.000 | <0.015 |

\*= low voltage tube
\*\*= high voltage tube

A way to provide more voltage gain out of tubes operating at low voltages is to "starve" the plate current such that the transconductance has not dropped too much (e.g., which allows for using a higher value plate load element, resistor, or impedance device). This leads to another experiment, circuit, or embodiment with high voltage pentodes, the plate load resistor, R3 is changed from 1KΩ to 100KΩ. Vin=0.1 volt peak to peak AC signal. See Table 2.

TABLE 2

Selected pentodes with reduced plate current, which allows for higher voltage gain.

| TUBE | $V_p$ (v) | $I_p$ (mA) | $V_{g2}$ (v) | Vout p-p | $g_m$ (mS) | HD$_2$ (%) | HD$_3$ (%) |
|---|---|---|---|---|---|---|---|
| 6BJ6** | 45 | 0.13 | 6.0 | 5.060 | 0.506 | 2.000 | 0.150 |
| 12BA6** | 45 | 0.25 | 6.0 | 5.500 | 0.550 | 0.300 | 0.100 |

\* = low voltage tube
\*\*= high voltage tube

A method of starving the screen grid voltage to allow for high resistance loads, high gains can be achieved. For example, we will reiterate the following information from Table 2 where the plate load resistor is 100KΩ. Again, Vin=0.1 volt peak to peak AC signal. See Table 3. Note: $g_{meq}$ is the equivalent transconductance based on the measured voltage gain.

TABLE 3

Voltage gain of two vacuum tube amplifiers.

| TUBE | $V_p$ (v) | $I_p$ (mA) | $V_{g2}$ (v) | Vout p-p | $g_{meq}$ (mS) | GAIN |
|---|---|---|---|---|---|---|
| 6BJ6** | 45 | 0.13 | 6.0 | 5.060 | 0.506 | 50.6 |
| 12BA6** | 45 | 0.25 | 6.0 | 5.500 | 0.550 | 55.0 |

\*\*= high voltage tube

In another experiment, circuit, or embodiment with the 6BJ6, plate load resistor, R3, is raised from (e.g., about) 100KΩ to 200KΩ. The resulting AC output signal increased from 5.060 volts peak to peak to 9.045 volts peak to peak. Had the tube provided infinite internal plate to cathode resistance we would have expected twice of 5.06 volts peak to peak or about 10 volts peak to peak. Instead, the voltage output voltage is slightly smaller at 9.045 volts peak to peak. From about a 10% loss from the ideal situation, the inferred internal plate resistance is about 2MΩ for 0.13 mA plate current. Nevertheless, the voltage gain with a 200KΩ plate load resistor is about 90.45. Note that the voltage drop across the 200KΩ with 0.13 mA flowing through it is 26 volts, leaving 19 volts DC at the plate.

Similarly this plate current starving method works for the 12BA6 whose gain magnitude, |Vout/Vin|=5.500/0.100=55.0 for a 100KΩ plate load resistor. Although the plate current is higher at 0.25 mA, the voltage drop across the 100KΩ resistor is 25 volts, which leads to 20 volts at the plate. Note that the screen grid voltage shown in TABLE 2 is 6 volts, which is very low for high voltage or conventional tubes. In data sheets for both of these tubes (e.g., RCA Receiving Tube Manual RC-29, published in 1973), the recommended screen grid voltages are 100 volts for the 6BJ6 and 12BA6 with a 100 volt plate supply. Operating the screen grid voltages at 6 volts or at a much lower voltage than the recommended values is unexpected when for example voltage gains are provided.

Figure 2:
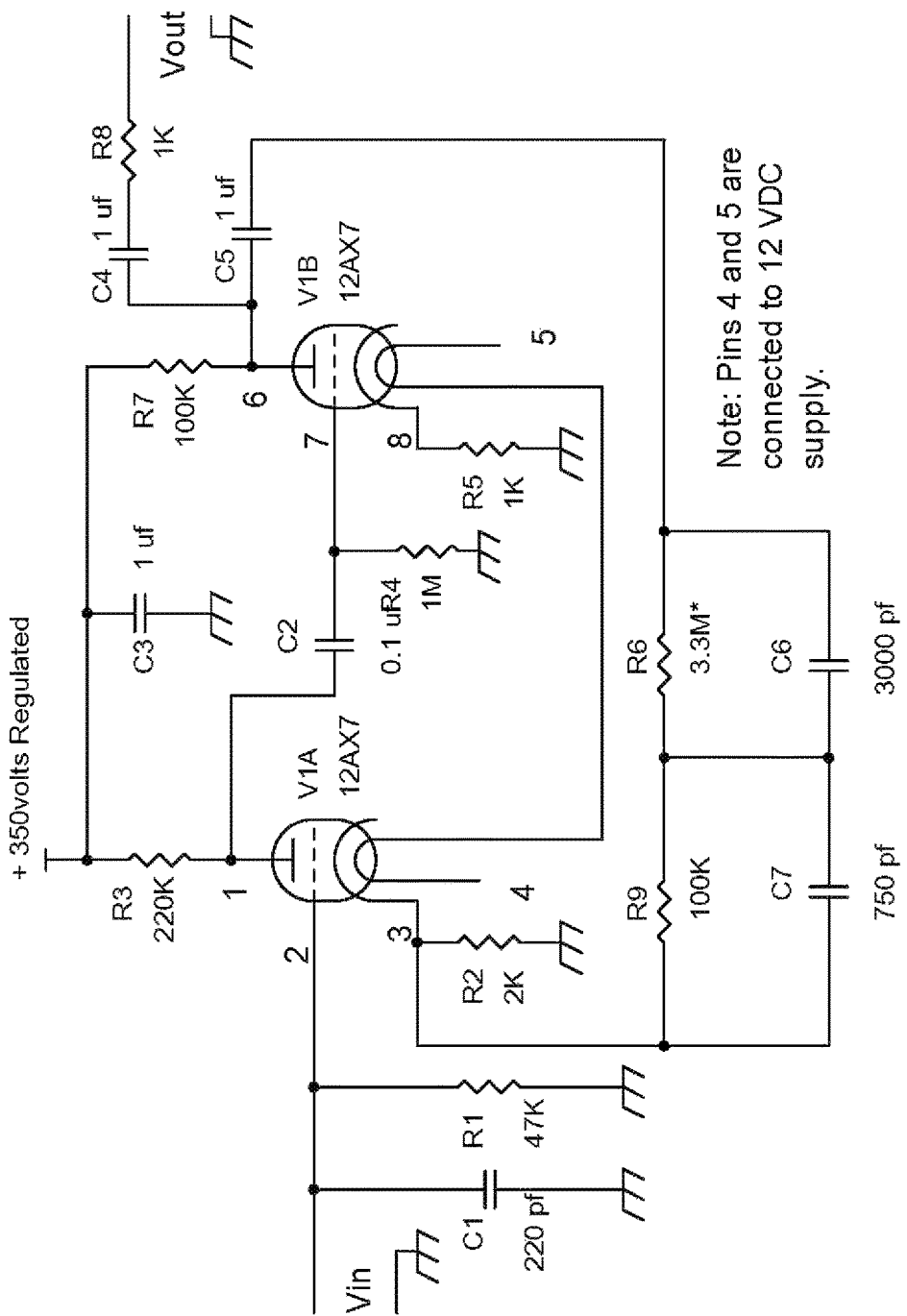
FIG. 2 shows a high voltage feedback amplifier.

FIG. 2 shows a prior art high voltage magnetic cartridge phono preamplifier that operates at 350 volts. This example high voltage preamp uses two common cathode amplifier stages.

Figure 3:
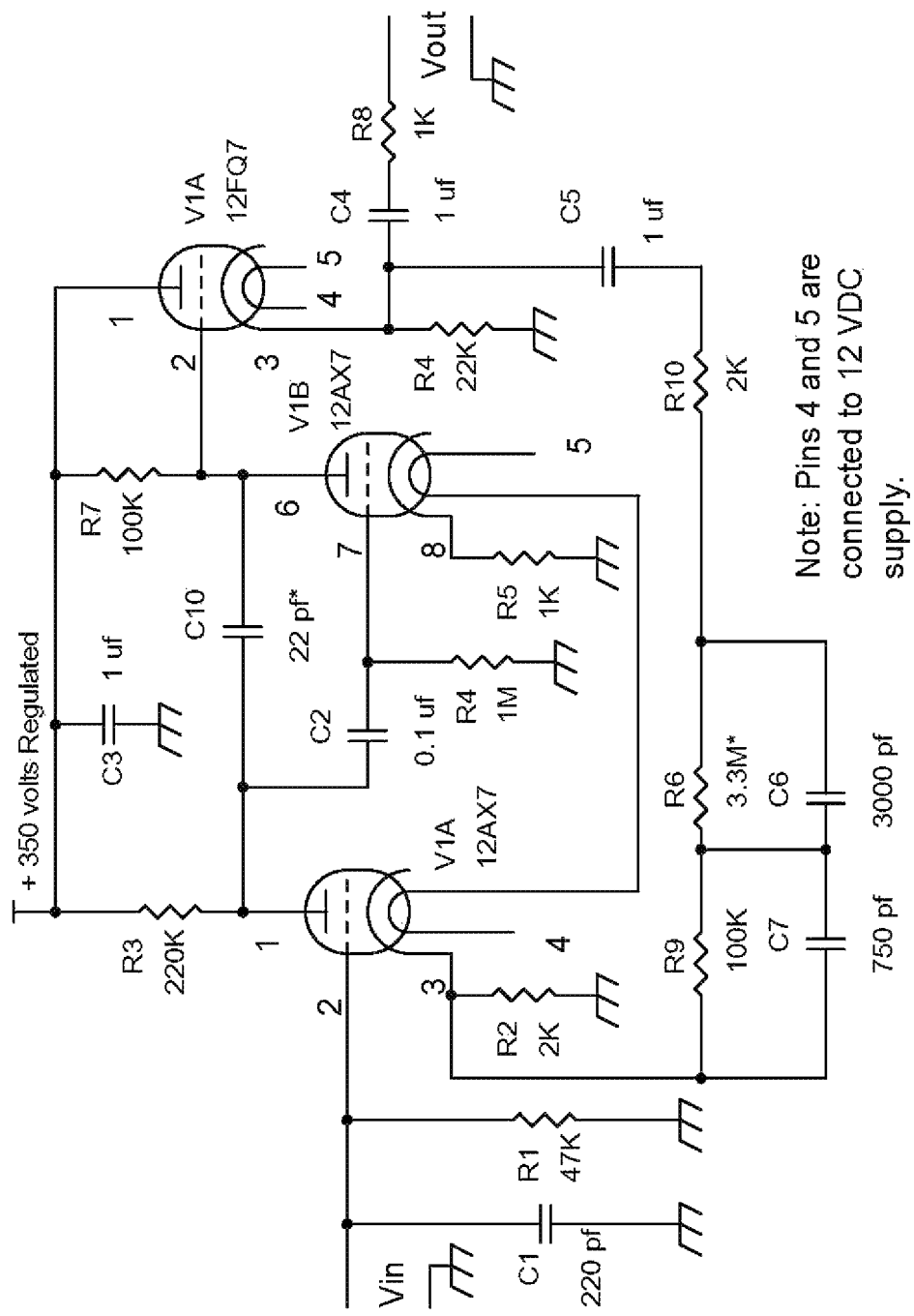
FIG. 3 shows another high voltage feedback amplifier.

FIG. 3 shows another prior art high voltage magnetic cartridge phono preamplifier that operates at 350 volts. This example high voltage preamp uses two common cathode amplifier stages with an added cathode follower stage to allow for increased open loop gain and extra current driving capability into its own (e.g., RIAA phono equalization) feedback network (e.g., including R6, C6, R9, C7). In both FIG. 2 and FIG. 3, high voltages are required such as 350 volts. In prior art similar phono preamplifiers, the plate supply usually exceeds 100 volts.

Figure 4:
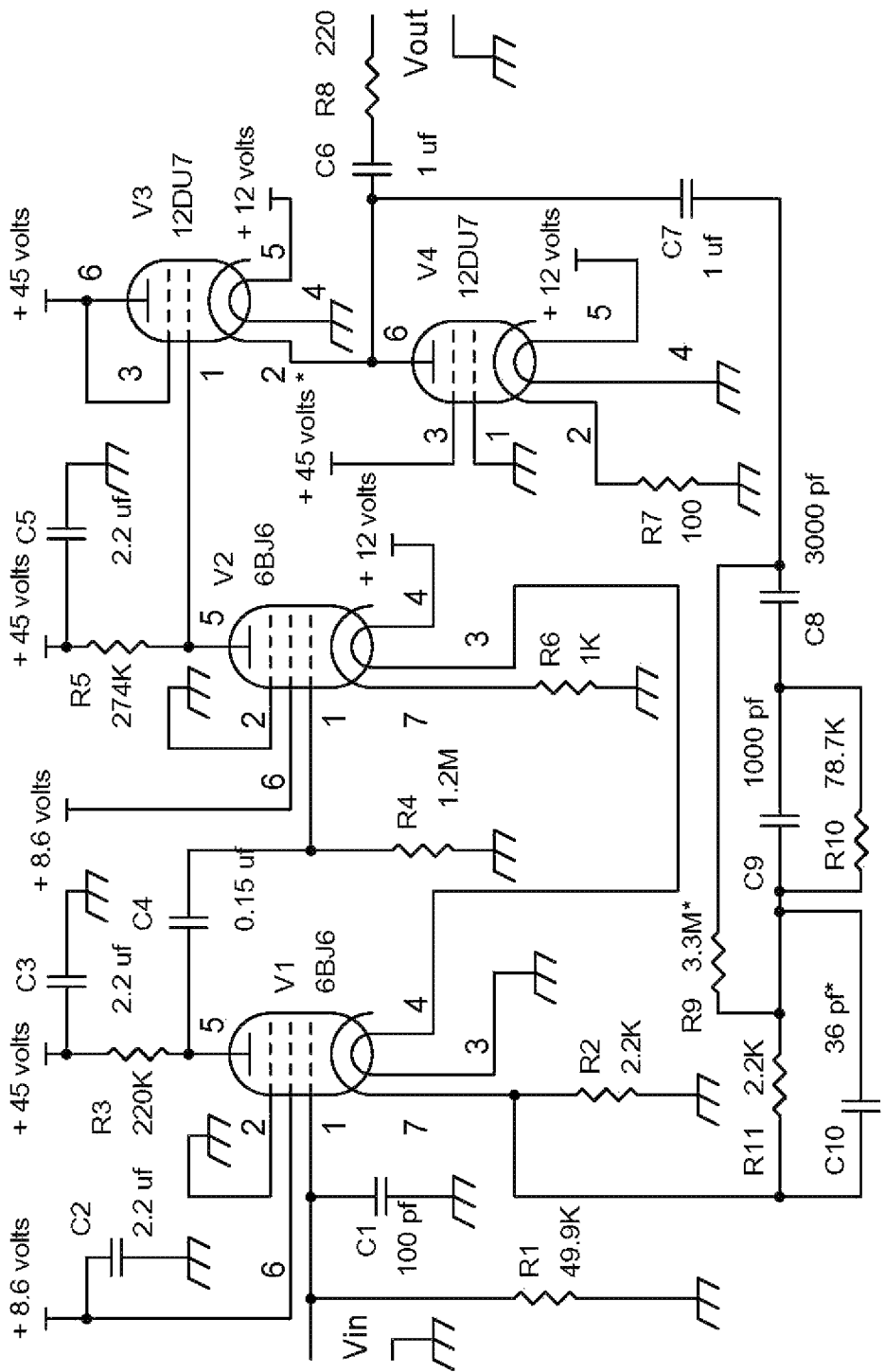
FIGS. 4, 5, 6, 7, 8, 9, 10, 11, 12, and 13 show examples of low voltage tube circuits.

FIG. 4 shows a preamplifier design with low screen grid voltages such as 8.6 volts. The preamp operates at less than 50 volts for the plate supply. Although the screen grid voltage is at 8.6 volts in this example, other voltages such as voltages ≤50 volts and ≥0 volts may be used. In FIG. 4 the first two stages use conventional high voltage tubes, whereas the cathode follower stage uses a low voltage tube. Alternatively, the cathode follower stage may include a high voltage tube instead of a low voltage tube.

Figure 5:
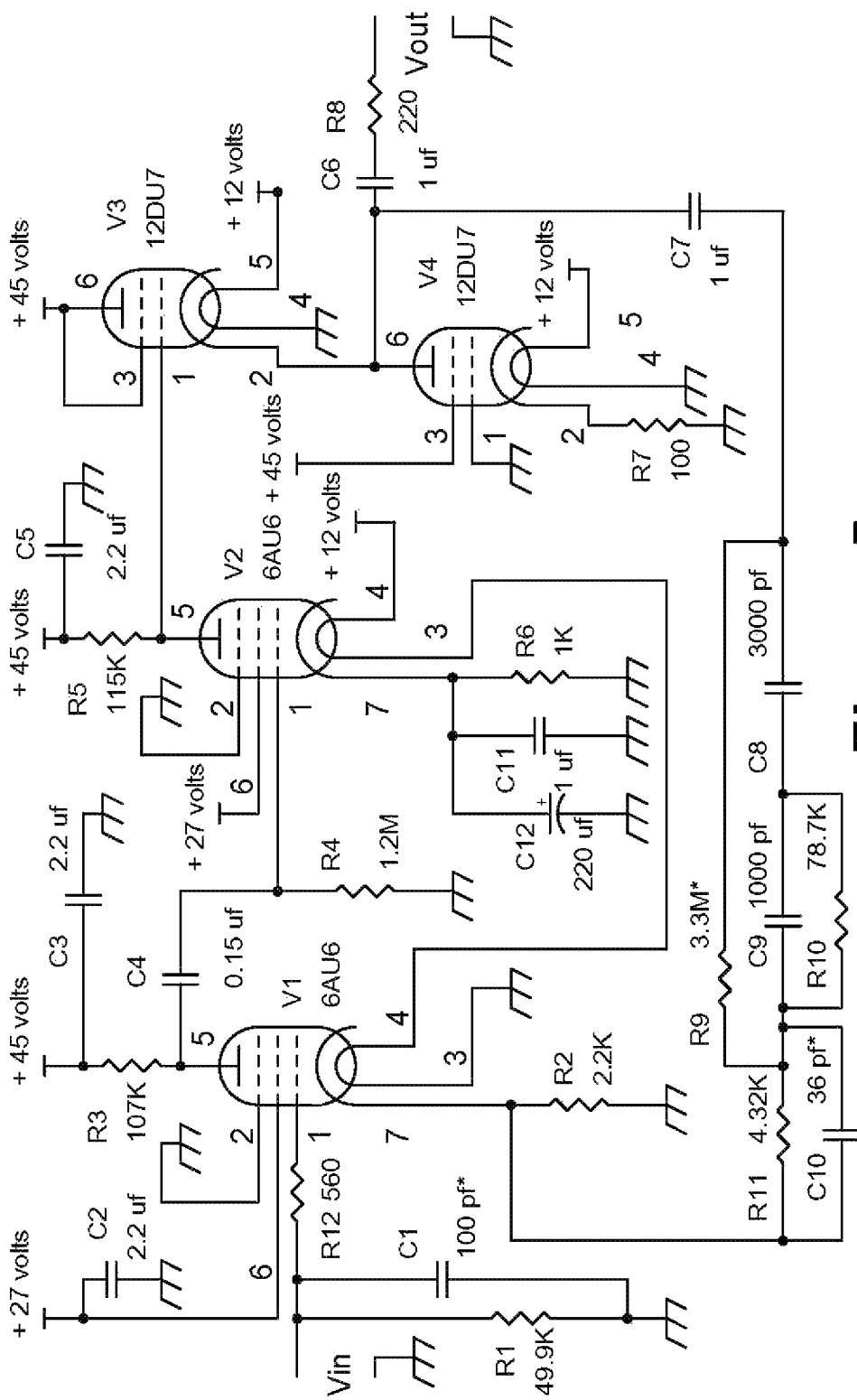

FIG. 5 shows another preamplifier design with slightly higher screen grid voltages at about 27 volts, which is well below the 100 volts as stated in the tube data sheet.

Figure 6:
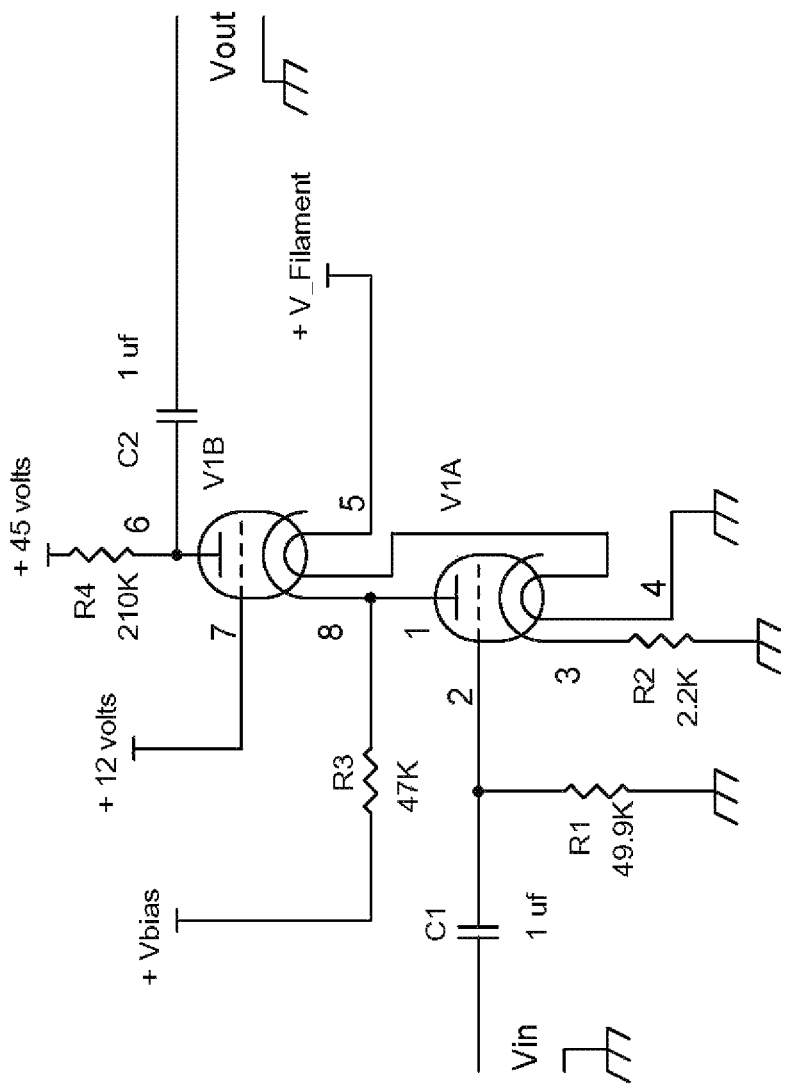

To achieve improved noise performance of a preamp, triodes are used in place of pentodes. Note: A triode may include a multi-grid (e.g., tetrode, pentode, hexode, heptode, octode, or the like) tube wherein one or more grid(s) is coupled to a plate, or when a grid provides an output signal. Triodes generally have lower voltage gain than pentodes because their plate resistances are generally lower than pentodes. To raise the plate resistance and or increase the voltage gain, a cascode amplifier is used and it shown in FIG. 6. In FIG. 6 the cascode amplifier includes a common cathode stage to receive an input signal at its control grid for example in V1A. The plate output of V1A is then coupled to the cathode of V1B, whose grid is supplied by a voltage potential that is an AC (alternating current) ground. The plate of V1B is coupled to an output terminal (e.g., Vout).

FIG. 6 shows a cascode circuit that allows forcing more plate current (via voltage source +Vbias and resistor R3) into the bottom tube while reducing the DC plate current for the top tube, V1B. By reducing the DC plate current in the grounded grid amplifier tube V1B, a higher resistance value plate load resistor can be used, which will allow for higher AC signal gain. Fortunately, most of the signal current from the plate of the common cathode amplifier V1A will flow into the low impedance, $1/g_{mV1B}$, cathode terminal of V1B. Very little signal current is diverted through R3 whose resistance is 47KΩ, which is much greater than $1/g_{mV1B}$.

There is also a cathode resistor, R2, which may be part of a feedback network. By applying an AC signal (e.g., 0.033 mV peak to peak), we will determine the gain at Vout. Various tubes will be tested to determine the highest voltage gain.

It was found that varying +Vbias affected the cascode amplifier's gain. Table 4 shows maximum voltage gain based on the final adjusted +Vbias DC voltage. Note: +Vbias may be varied to provide a voltage controlled (e.g., gain) amplifier. Note that +Vbias may include a positive, zero, or negative voltage.

TABLE 4

Gain of cascode amplifier from FIG. 6

| TUBE | +Vbias (v) | |GAIN| |
|---|---|---|
| 6BQ7** | 13.3 | 27.9 |
| 6DJ8** | 14.0 | 40.5 |
| 6GM8* | 32.4 | 36.4 |
| 6N2** | 15.3 | 37.1 |
| 6N6** | 12.7 | 15.0 |
| ECC99** | 10.9 | 9.7 |
| 12AT7** | 15.0 | 35.5 |
| 12AU7** | 24.1 | 33.3 |
| 12AV7** | 13.8 | 38.2 |
| 12AY7** | 13.9 | 33.9 |
| 12AX7** | 10.0 | 18.5 |
| 12BH7** | 29.8 | 38.2 |
| 12DT8** | 13.6 | 36.1 |
| 12FQ7** | 18.0 | 40.9 |
| 12U7* | 19.5 | 32.7 |

Figure 7:
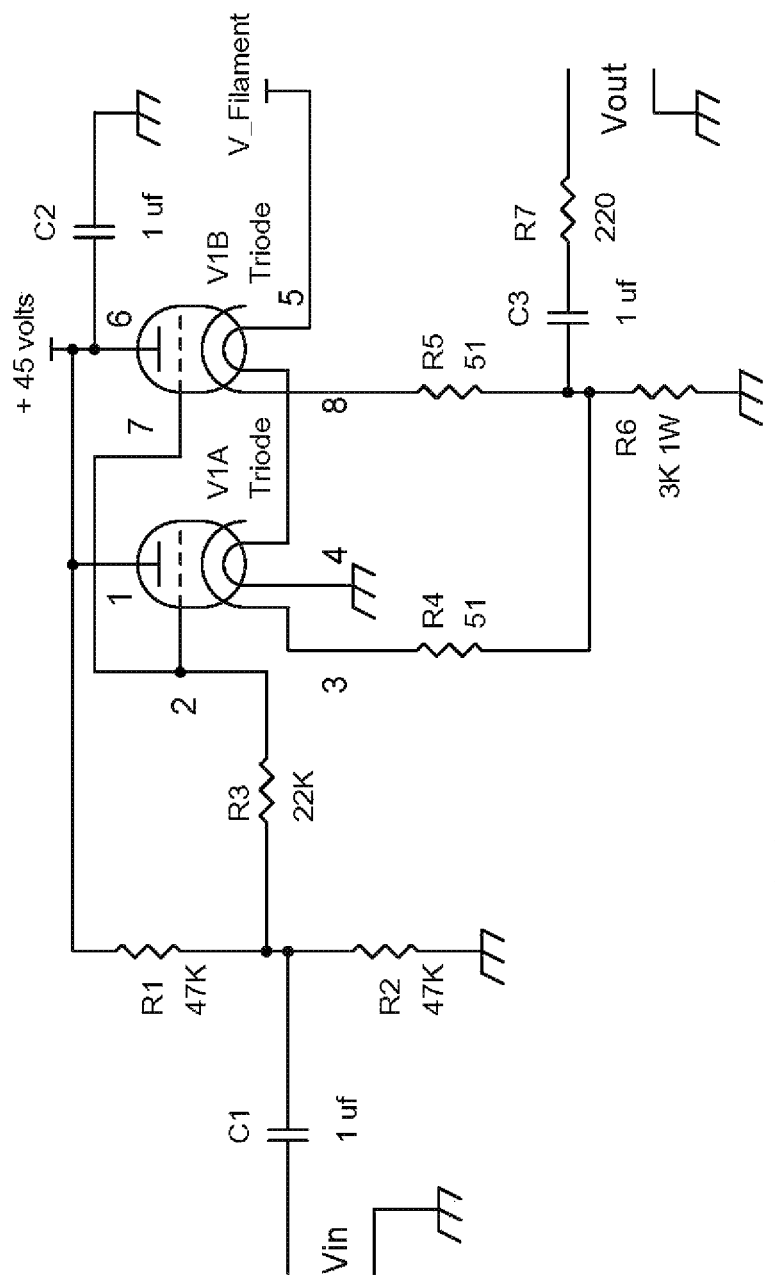

Vin = 0.033 volt peak to peak AC signal.
*= low voltage tube
= high voltage tube FIG. 7** shows a cathode follower circuit, which is used for testing various output voltage swings (e.g., maximum voltage swing for a given plate supply voltage).

This circuit in FIG. 7 is different from the active current source (e.g., V4) 12DU7 cathode follower (e.g., V3) shown in FIG. 4 that outputted about 18 volts peak to peak. More output voltage swing with a simpler circuit was achieved by choosing the best triode for this circuit in FIG. 7. See Table 5. (Note that R6 or a resistor may be replaced with a current source or circuit.)

TABLE 5

Output signal voltage from the FIG. 7 cathode follower circuit.

| TUBE | Vout p-p |
|---|---|
| 6DJ8** | 15 |
| 6GM8* | 22 |
| 12FQ7** | 11 |

*= low voltage tube
**= high voltage tube

In FIG. 7, Vin=22 volts peak to peak AC signal at 1 kHz, and peak to peak voltage is measured at Vout. The input grids are biased to 22.5 volts DC via R1 and R2. Resistor R3 represents an arbitrary finite source resistance. Other R3 resistor values could have been chosen (e.g., but this may or may not have affected the maximum output voltage swing).

Figure 8:
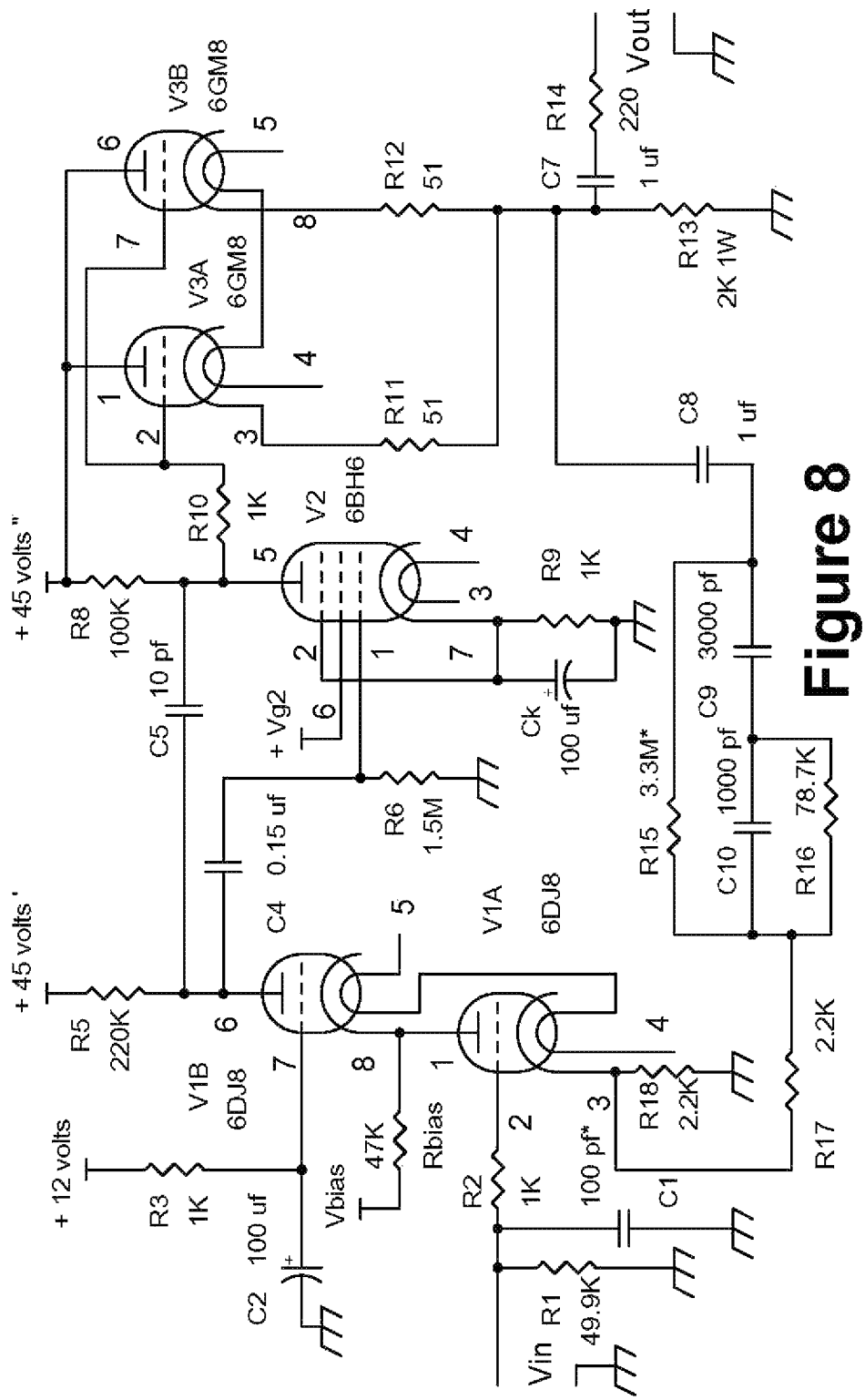

FIG. 8 shows a low voltage amplifier having a cascode circuit (e.g., V1A and V1B) that has improved output swing using an output circuit similar to the circuit in FIG. 7. Here, the cathode follower uses a low voltage tube such as the 6GM8. Of course satisfactory performance in output voltage swing can be provided using a high voltage tube, such as for example, a 6DJ8 as a cathode follower.

In FIG. 8, Vbias=15.6 volts DC (via Rbias), Plate voltage at pin 6 of the 6DJ8=18.0 volts DC. Screen grid voltage Vg2=35.7 volts DC at pin 6 of V2 6BH6.

Figure 9:
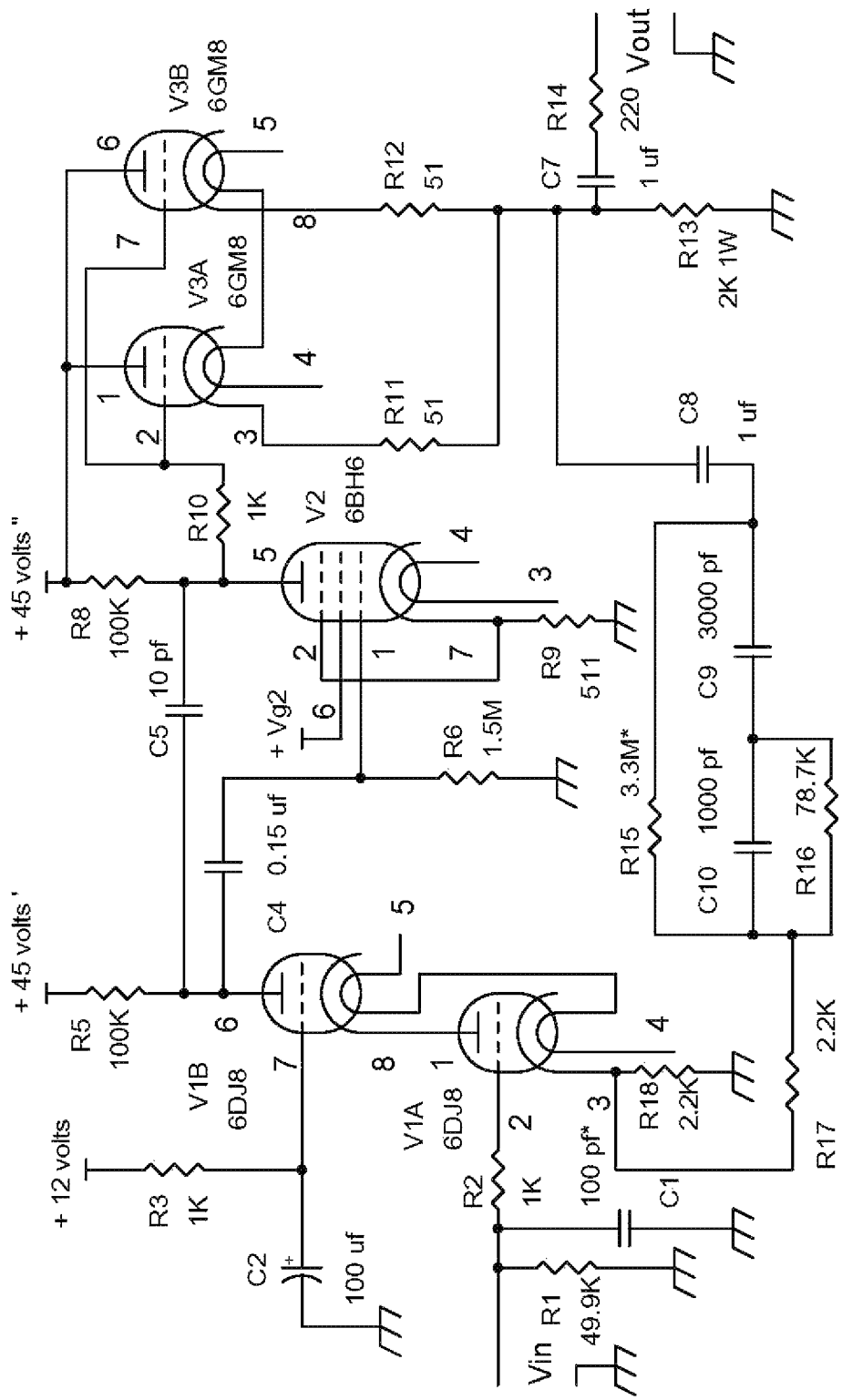

FIG. 9 shows yet another example cascode low voltage tube preamplifier, which includes the following: Vg2=30.8 volts DC, but note that when using high voltage tubes like the 6BH6 with low voltages, the screen grid voltage, Vg2, should be adjusted for maximum voltage swing for each 6BH6 tube selected. In this case Vg2 was adjusted so that V2's quiescent plate voltage at pin 5 is 16.0 volts DC for maximum signal swing at the output. Also the circuit in FIG. 9 measured as follows:

Signal to noise ratio=75 dB referenced to 5 mV RMS at the input with "A" weighting with a 25 kHz single pole low pass filter and with the input terminal shorted.

Maximum output voltage=20 volts peak to peak.

Slew rate=+13 v/μsec and −15 volts/μsec.

Harmonic distortions, $HD_2$=0.080% and $HD_3$=0.085% at 1 volt RMS output at 1 kHz loaded into 10KΩ. FIG. 9 also can use conventional high voltage tubes in the cascode circuit (e.g., V1A and V1B) and or second stage (e.g., V2). In FIG. 9 the output stage cathode follower may use a conventional high voltage tube, or a low voltage tube.

Figure 10:
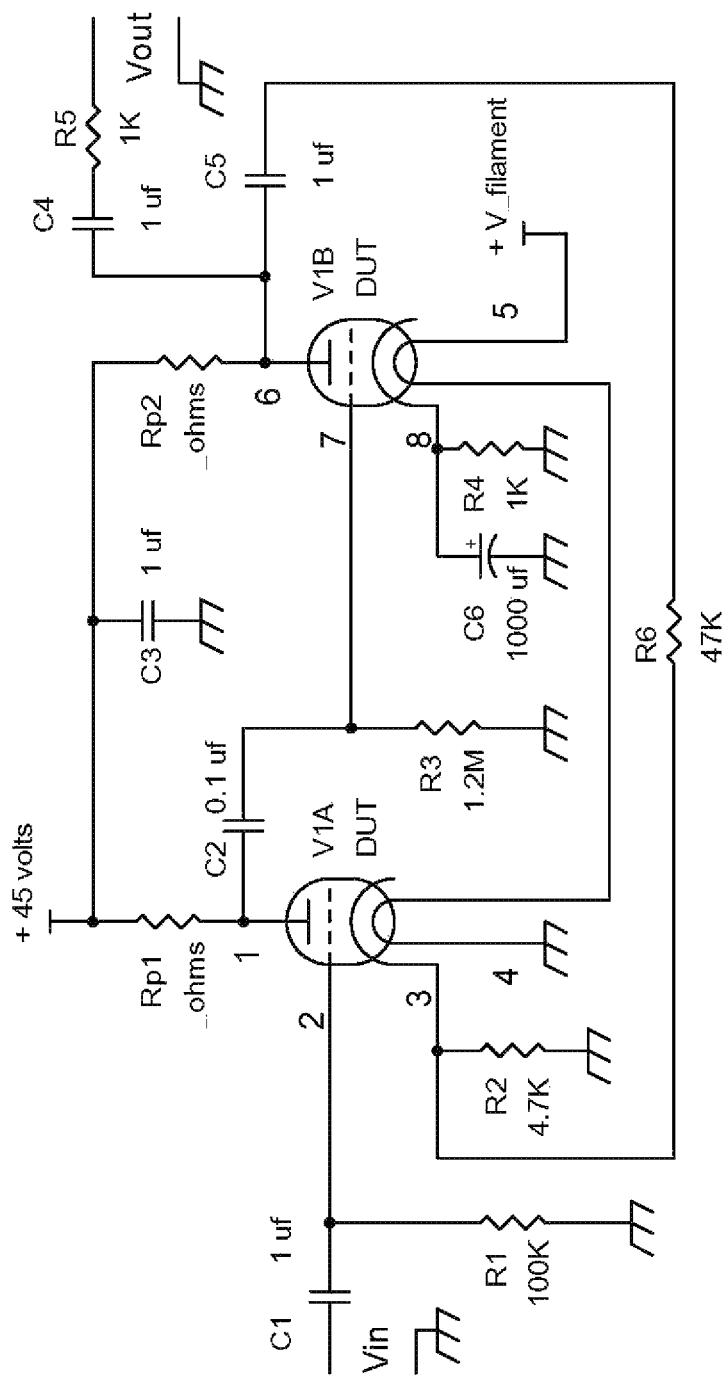

FIG. 10 shows a line level preamplifier. The original design with conventional high voltage tubes was powered by a >150 volt DC supply. It was found that a number of tubes that will work or work "best" at 45 volts. See FIG. 10. The nominal (e.g., plate) power supply voltage is 45 volts and other supply voltages below 100 volts can be used. For example a range of 16 to 35 volts for the plate power supply.

A summary of amplifier performance with examples in plate resistances for Rp1 and or Rp2 is presented in TABLE 6.

TABLE 6

Summary of various data on the line level preamplifier from FIG. 10.

| TUBE | Rp1 | Pin 1 (v) | Rp2 | Pin 6 (v) | Vout max | $HD_2$ (%) | $HD_3$ (%) |
|---|---|---|---|---|---|---|---|
| 6BQ7** | 127 KΩ | 20.5 | 34 KΩ | 26.4 | 14.4 | 0.150 | 0.070 |
| 6DJ8** | 87 KΩ | 28.3 | 26 KΩ | 25.6 | 21.0 | 0.100 | 0.030 |
| 6GM8* | 68 KΩ | 23.5 | 28 KΩ | 18.7 | 26.6 | 0.080 | 0.030 |
| 6N2** | 116 KΩ | 26.7 | 141 KΩ | 31.2 | 10.3 | 0.200 | 0.120 |
| 6N6** | 104 KΩ | 27.6 | 39 KΩ | 27.0 | 14.7 | 0.030 | 0.120 |
| ECC99** | 110 KΩ | 26.7 | 141 KΩ | 31.5 | 12.7 | 0.210 | 0.120 |
| 12AT7** | 123 KΩ | 27.0 | 56 KΩ | 30.0 | 12.4 | 0.240 | <0.015 |
| 12AU7** | 78 KΩ | 24.7 | 43 KΩ | 20.5 | 20.0 | 0.150 | <0.015 |
| 12AX7** | 123 KΩ | 34.7 | 169 KΩ | 39.4 | 3.1 | 1.200 | 0.600 |
| 12AY7** | 124 KΩ | 26.5 | 54 KΩ | 35.2 | 8.5 | 0.240 | <0.015 |
| 12BH7** | 112 KΩ | 17.5 | 36 KΩ | 18.1 | 21.0 | 0.200 | <0.015 |
| 12FQ7** | 131 KΩ | 19.0 | 32 KΩ | 25.0 | 18.8 | <0.015 | 0.060 |
| 12U7* | 67 KΩ | 24.3 | 36 KΩ | 20.5 | 20.0 | <0.015 | 0.080 |

*= low voltage tube
**= high voltage tube

TABLE 6 shows that although specially designed low voltage tubes such as the 6GM6 (AKA ECC86) provide the most voltage swing, many conventional high voltage tubes such as the 6DJ8 (AKA 6922, ECC88, or equivalent) or 12AU7 and or 12BH7 provided 80% (or better) of the voltage swing output as the 6GM6.

The closed loop gain was very close within about 10% between many of the different tubes used. See TABLE 7.

TABLE 7

Closed loop gain of the amplifier in FIG. 10 with various tubes.

| TUBE | |GAIN| |
|---|---|
| 6BQ7** | 9.6 |
| 6DJ8** | 9.6 |
| 6GM8* | 8.9 |

TABLE 7-continued

Closed loop gain of the amplifier in FIG. 10 with various tubes.

| TUBE | |GAIN| |
|---|---|
| 6N2** | 9.9 |
| 6N6** | 8.8 |
| ECC99** | 9.3 |
| 12AT7** | 9.7 |
| 12AU7** | 8.3 |
| 12AY7** | 9.6 |
| 12BH7** | 9.1 |
| 12FQ7** | 9.3 |
| 12U7* | 8.3 |

*= low voltage tube
**= high voltage tube

Figure 11:
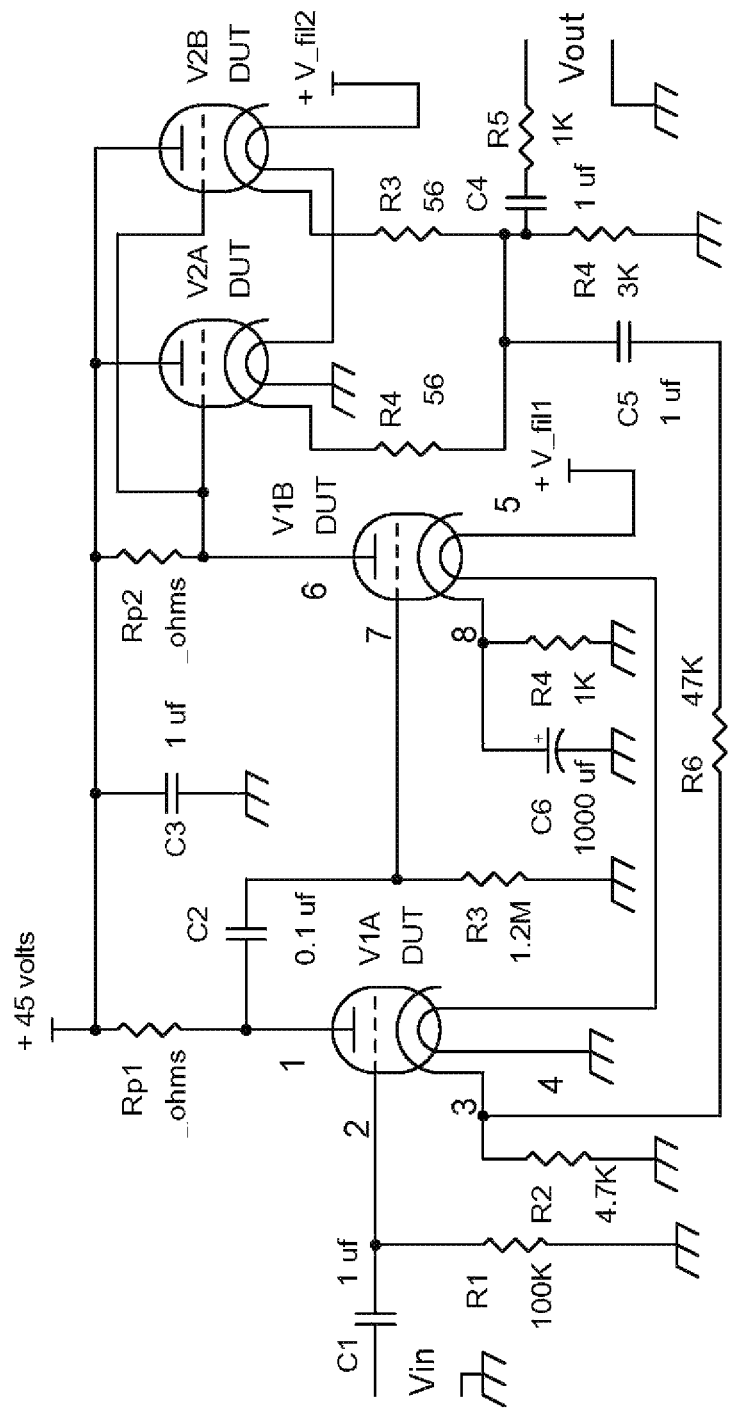

FIG. 11 shows an example of a low voltage tube amplifier with cathode follower output stage. Although in one example uses low voltage tubes, any combination of high voltage and or low voltage tubes can be used. For example: For a low voltage line preamp with maximum output voltage swing includes the following:
V1A V1B and V2A V2B=6GM8/ECC86,
Rp1=86.6KΩ
Rp2=32.4KΩ
R4=3KΩ, 1 watt
For improvements to FIG. 11:
C4→2.2 uf to 4.7 uf film or polystyrene capacitor. This will improve low frequency response for those amplifier with 10KΩ input resistance.
R5→100Ω for lower output resistance from the preamp. With R5=100Ω this preamp's performance into a 10KΩ load has the following:
Maximum voltage output=23.5 volts peak to peak at 1 kHz
With 1 volt RMS output at 1 kHz, $HD_2$=0.060%, $HD_3$=0.036%
Small signal bandwidth=540 kHz.
Also a 1 uf to 4.7 uf film or polystyrene capacitor wired in parallel with C6 (1000 uf), ensures low impedance at high frequencies.

Figure 12:
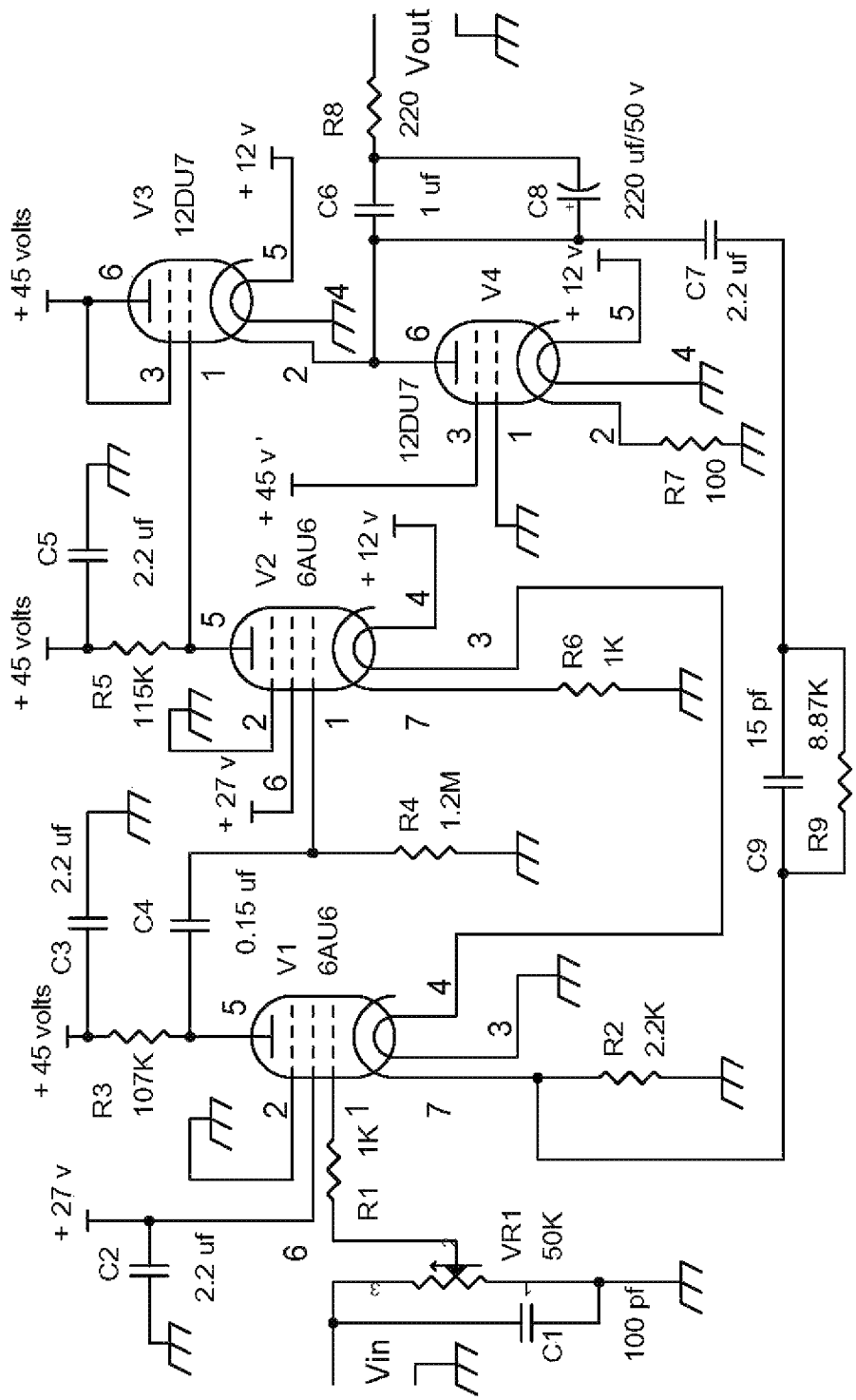

FIG. 12 shows a low voltage tube headphone amplifier. The screen grids of V1 and V2 at pin 6 are coupled nominally to a well filtered and regulated 27 volts DC. Depending on which lot of 6AU6 tubes you have, the pin 6 voltage is adjusted for maximum voltage swing at Vout without a load resistor. Note that FIG. 11 may also be used as a line level amplifier.

Figure 13:
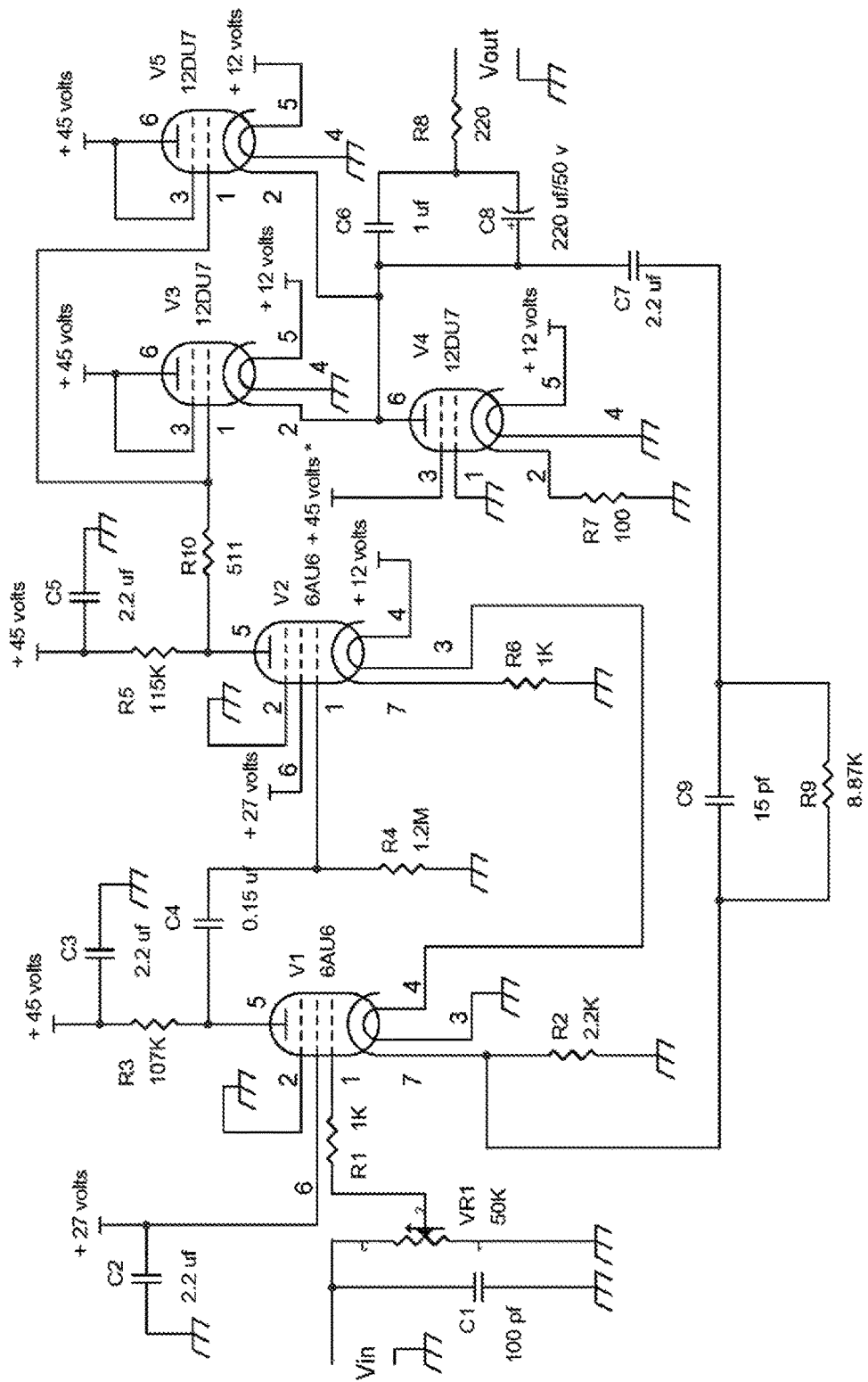

Connecting a 100Ω load to Vout yielded the following results:
Signal to noise ≥90 dB referenced to 0.50 volt RMS output ("A" weighting and 25 kHz low pass filter). At 1 volt peak to peak into 100Ω at 1 kHz,
$HD_2$=0.03% and $HD_3$=<0.03%
Small signal bandwidth=650 kHz (−3 dB)
Slew rate=+8 v/μsec, −30 v/μsec
Maximum output voltage=2.30 volts peak to peak FIG. 13 shows an improved headphone amplifier that provides more output current into the headphone. This headphone amplifier is shown with paralleled triodes, V3 and V5 deliver sufficient volume to a headphone. The measure results are as follows:
At 2 volts peak to peak into 100Ω for 1 kHz,
$HD_2$=0.08% and $HD_3$=0.015%
With 1 volt peak to peak under the same conditions,
$HD_2$<0.015% and $HD_3$<0.015%
The circuit in FIG. 13 provided 4.5 volts peak to peak into a 100Ω load compared to 2.3 volts peak to peak in the previous version shown in FIG. 12. With the greater signal output, the amplifier of FIG. 13 is suitable to load into a 50Ω headphone. Without a load at Vout, this amplifier delivered 14.3 volts peak to peak, and this headphone amplifier can also be used as a line amplifier. Output resistor R8 can be replaced with another value depending on the headphone. For example, if we are using 250Ω to 600Ω headphones (e.g., Beyer DT 770 Pro 250 ohm or Beyer DT 990 Premium 600Ω), then the output resistor R8 may be lowered to 22Ω.

Figure 14:
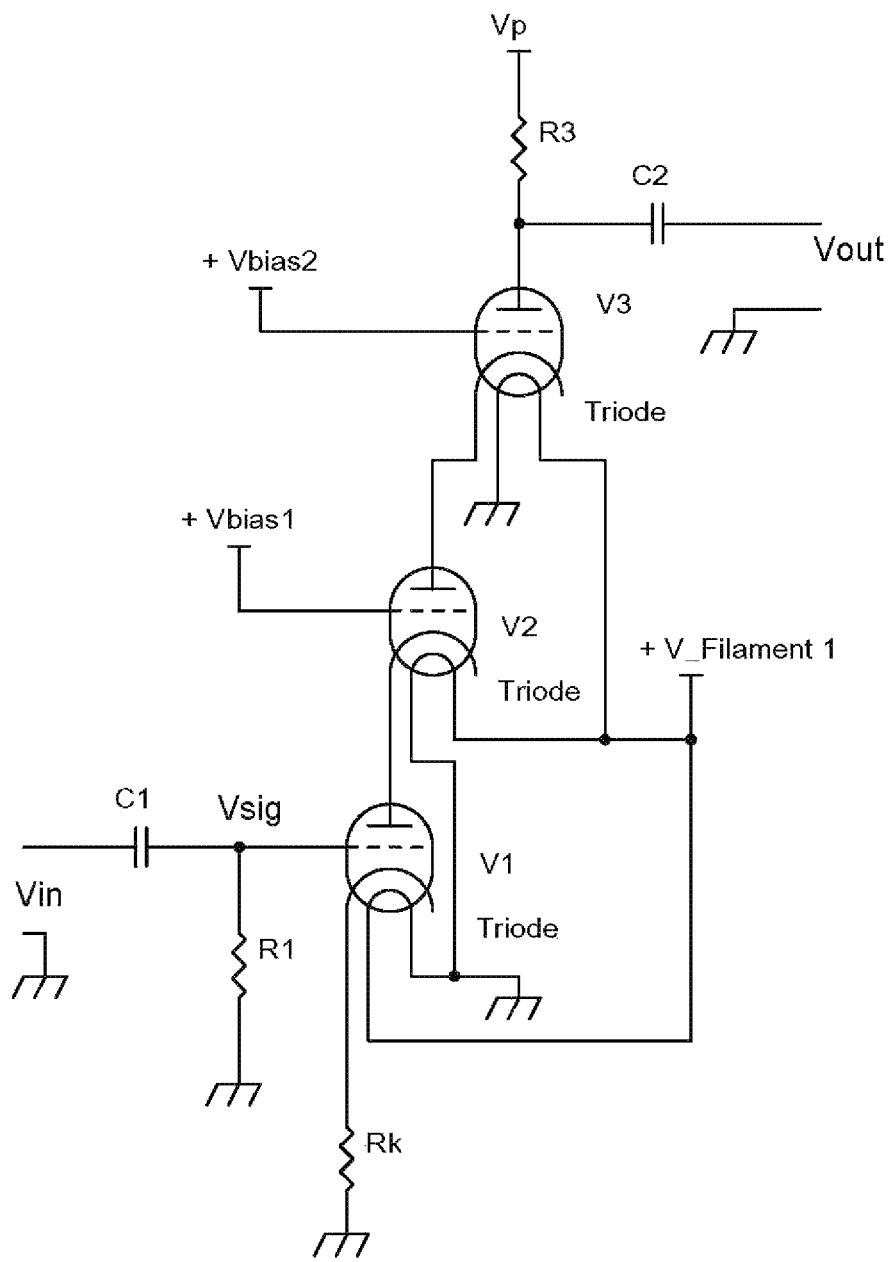
FIG. 14 shows a multiple cascoded circuit.

To further increase gain in a single voltage amplifier stage, FIG. 14 shows an example of a multiple cascode circuit. A common cathode amplifier, V1, has its plate of V1 to a cathode of V2. Amplifier V2 is an AC grounded grid amplifier. The output plate terminal of V2 is then coupled to the cathode of V3, another AC grounded grid amplifier. Output is provided via plate load resistor R3 in this example from FIG. 14.

The grid bias voltages +Vbias1 and or +Vbias2 are typically a voltage via a resistor or biasing network or voltage source. Typically, +Vbias1 is less than +Vbias2 in terms of DC voltages.

As a result of having two or more AC grounded grid amplifiers (e.g., instead on one AC grounded grid amplifier), the output resistance (e.g., output resistance at the plate of V3 referenced to ground) is raised, which allows for higher plate load resistance at R3 to provide (e.g., improved) higher voltage gain. FIG. 14 shows an example of two AC grounded grid amplifiers, V2 and V3, but other implementations may include more than 2 AC grounded grid amplifiers. Another embodiment may include a biasing network or resistor to force "positive going" current into the plate of V1, V2, and or V3. By forcing extra current as mentioned, the DC plate current can be reduced and thus allow for utilizing a higher plate resistance (e.g., or impedance) load at V3 such that higher voltage gain is provided.

Figure 15:
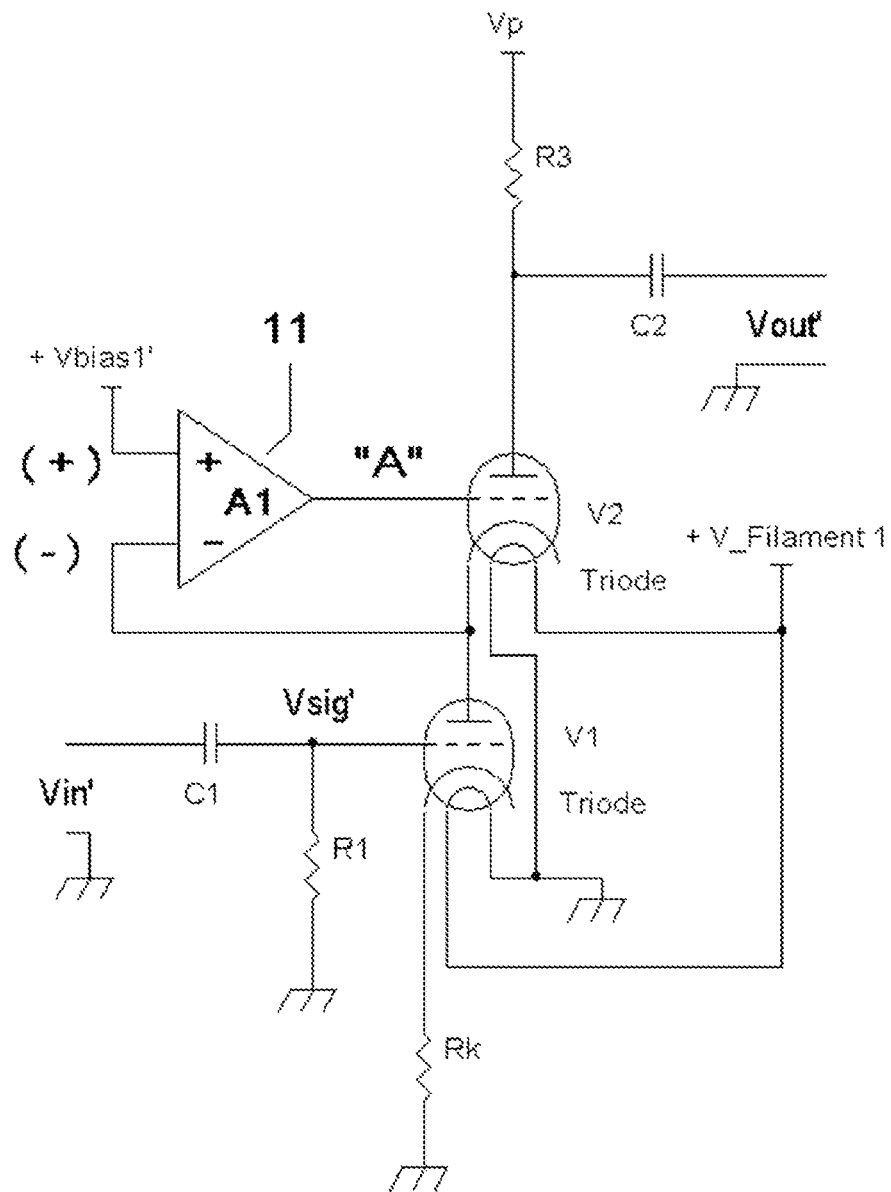
FIG. 15 shows a feedback cascode circuit using an amplifier.

FIG. 15 shows another way to provide higher voltage gain by increasing the effective plate resistance of V2 via an amplifier, 11.

By utilizing amplifier (e.g., in FIG. 15), 11, which for example, can be implemented with an operational amplifier, amplifier, or for example any amplifier shown in FIGS. 16, 17, 18, 19, and or 20. By using a feedback amplifier wherein a non inverting input, (+), of amplifier 11, is coupled to a bias voltage (e.g., positive voltage), Vb' (or +Vb'), an inverting input, (−), of amplifier 11 is coupled to the cathode of V2 and or plate of V1, and wherein the output of the amplifier 11 is coupled to the grid of V2, higher voltage gain is provided at R3 via the plate of V2. The amplifier 11 also provides for higher plate resistance at the plate of V2 (e.g., referenced to ground), which is related to the voltage gain of amplifier 11. Amplifier 11 with a gain of greater than 0 or 1, provides higher voltage gain and or output plate resistance at the plate of V2 than a conventional cascode wherein the conventional cascode circuit would remove amplifier 11, and connect a bias voltage to the grid of V2.

In FIG. 15 amplifier 11 may include one or more amplifying elements such as a tube, transistor, field effect transistor, and or the like. For example, with a transistor, the bias voltage (e.g., Vb' or +Vb') is coupled to the emitter of the transistor (e.g., the (+) input terminal), the collector (e.g., with a collector load element or load resistor) provides the output that is coupled to the grid of V2, and the cathode of V2 is then coupled to the base of the transistor. An embodiment may include a DC level shifting circuit between the collector of the transistor and the grid of V2.

Alternatively (e.g., for amplifier 11), a field effect transistor (e.g., FET, JFET, MOSFET) or insulated gate bipolar transistor may be used wherein the bias voltage (e.g., Vb' or +Vb') is coupled to the source of the field effect transistor (e.g., the (+) input terminal), the drain (e.g., with a drain load element or load resistor) provides the output that is coupled to the grid of V2, and the cathode of V2 is then coupled to the gate of the field effect transistor or insulated gate transistor. An embodiment may include a DC level shifting circuit between the drain of the transistor and the grid of V2.

With an insulated gate transistor (e.g., for amplifier 11), the bias voltage (e.g., Vb' or +Vb') is coupled to the emitter of the insulated gate transistor (e.g., the (+) input terminal), the collector (e.g., with a collector load element or load resistor) provides the output that is coupled to the grid of V2, and the cathode of V2 is then coupled to the gate of the insulated gate transistor. An embodiment may include a DC level shifting circuit between the collector of the insulated gate transistor and the grid of V2.

An amplifier including another tube or third tube may be implemented for amplifier 11. For example, the bias voltage (e.g., Vb' or +Vb') is coupled to the cathode of the tube (e.g., the (+) input terminal for the third tube or another tube), the plate of the tube (e.g., with a plate load element or load resistor for the third tube) provides the output that is coupled to the grid of V2, and the cathode of V2 is then coupled to the grid of the (e.g. third) tube (e.g., the another tube or third tube). An embodiment may include a DC level shifting circuit between the plate of the (e.g., third) tube (the another tube or third tube) and the grid of V2 (e.g., in FIG. 15).

FIG. 15 shows that the amplifier 11 has a non inverting input terminal labeled (+), an inverting input terminal labeled (−), and an output terminal "A" that is coupled to the grid of tube, V2.

In FIGS. 16, 17, 18, 19, and or 20, for example, the (+), (−), and or "A" terminals or nodes correspond to the (+), (−), and or "A" terminals or nodes in FIG. 15.

Figure 16:
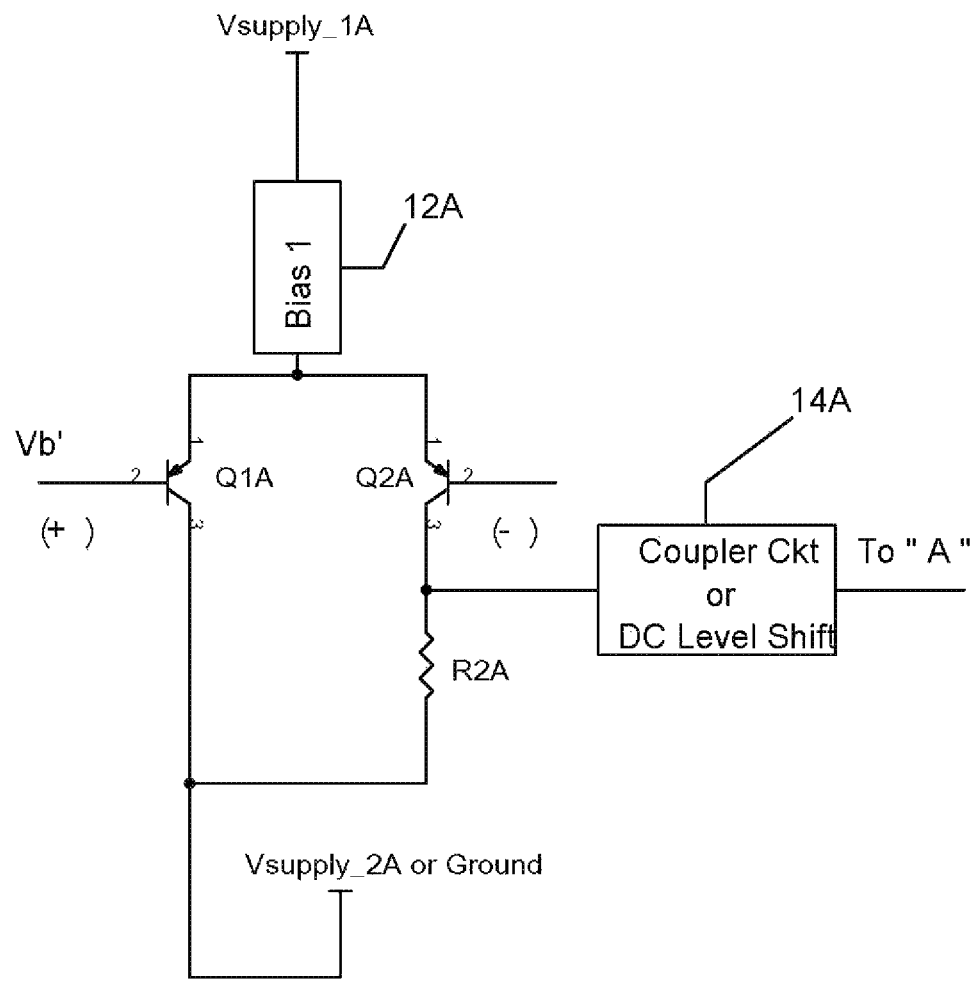
FIG. 16 shows an example transistor amplifier.

FIG. 16 shows an example (e.g., PNP) transistor circuit of amplifier 11 where the non inverting input (+) is coupled to the base of Q1A, the inverting input is coupled to the base of Q2A, and the output is coupled to the collector of Q2A via a wire, or coupler circuit (e.g., 14A), or a DC level shifting circuit (e.g., 14A). A bias circuit, 12A, supplies a DC current to the emitters of Q1A and Q2A. Note that one or more emitters from Q1A and or Q2A may include a feedback element (e.g., local and or global feedback element, or one or more emitter degeneration elements or resistors).

Figure 17:
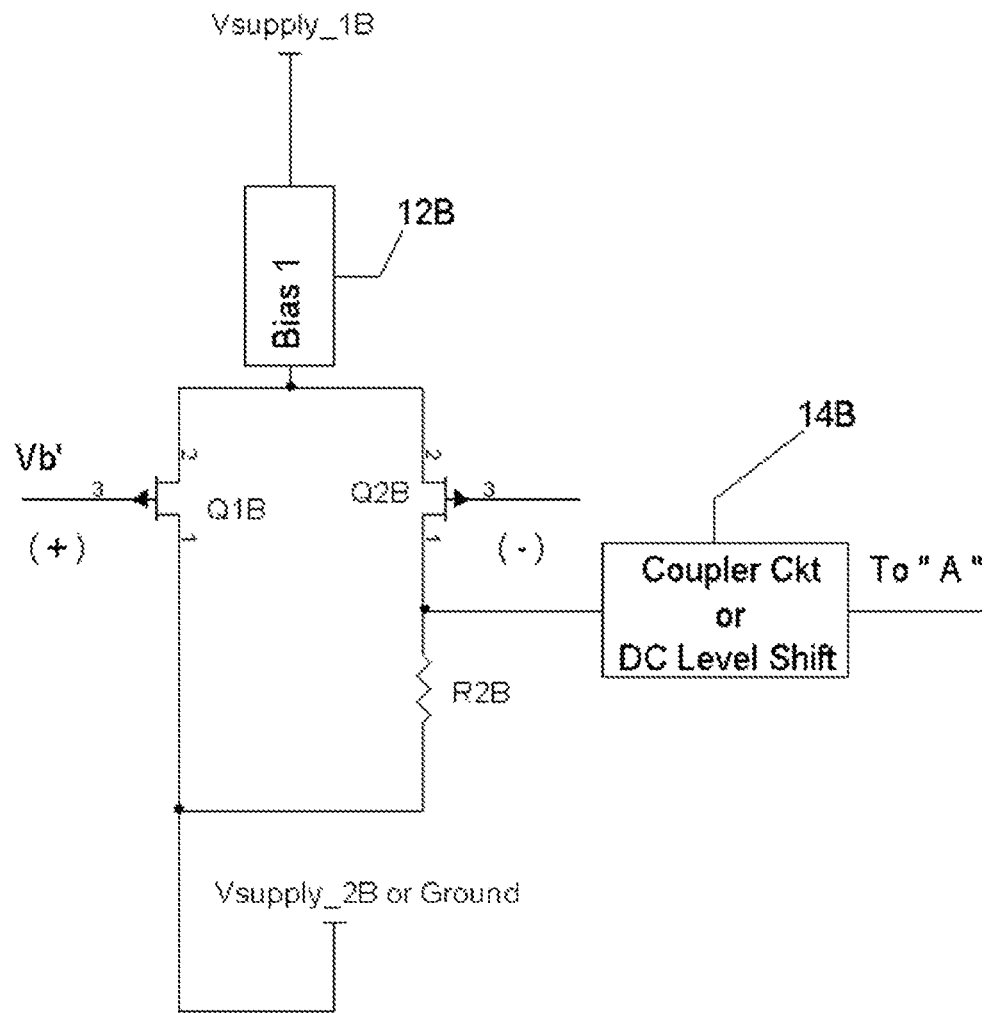
FIG. 17 shows an example FET (e.g., Field Effect Transistor) amplifier.

FIG. 17 shows an example (e.g., P-Channel) FET circuit of amplifier 11 where the non inverting input (+) is coupled to the gate of Q1B, the inverting input is coupled to the gate of Q2B, and the output is coupled to the drain of Q2B via a wire, or coupler circuit (e.g., 14B), or a DC level shifting circuit (e.g., 14B). A bias circuit, 12B, supplies a DC current to the sources of Q1B and Q2B. Note that one or more sources from Q1B and or Q2B may include a feedback element (e.g., local and or global feedback element, or one or more source degeneration resistors or elements).

Figure 18:
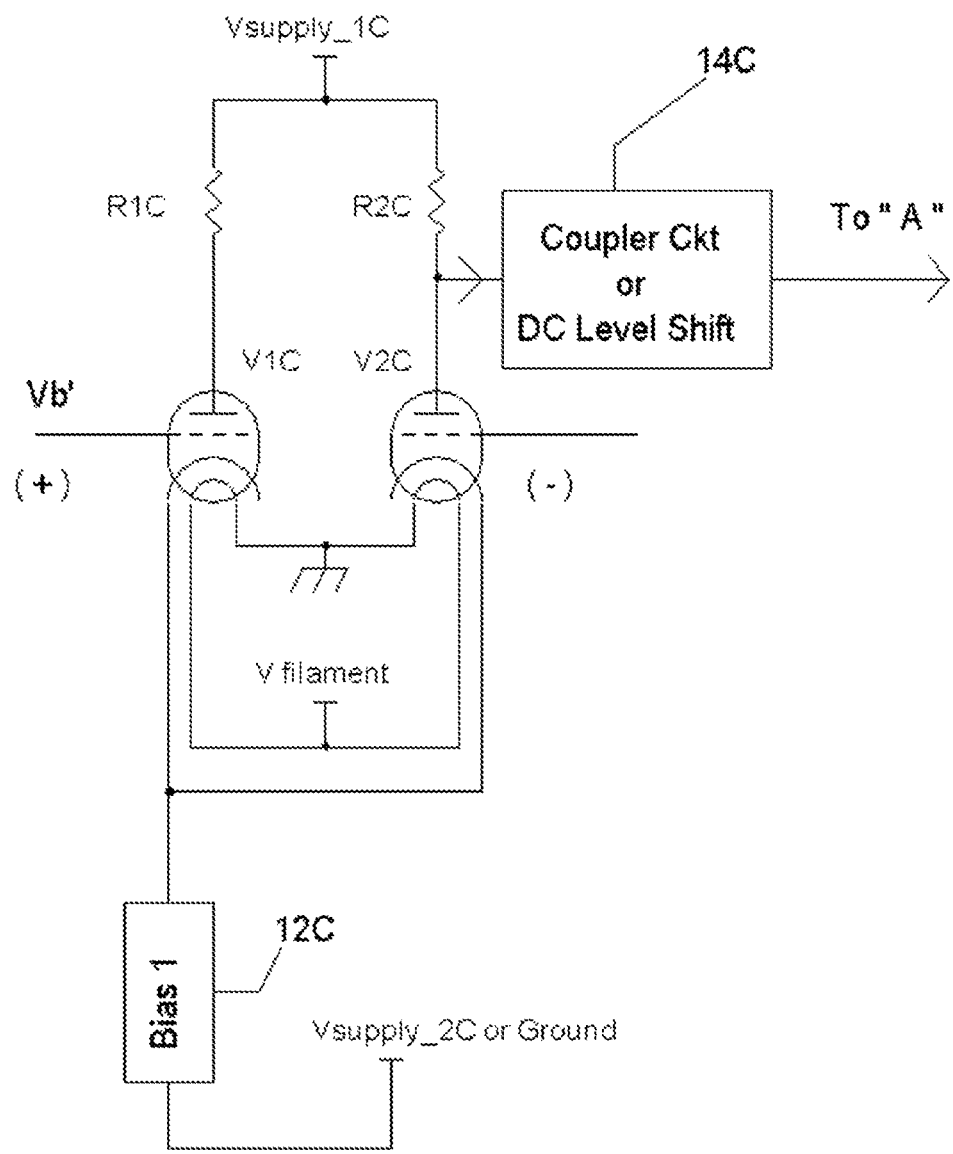
FIG. 18 shows an example tube amplifier.

FIG. 18 shows an example (e.g., triode) tube circuit of amplifier 11 where the non inverting input (+) is coupled to the grid of V1C, the inverting input is coupled to the grid of V2C, and the output is coupled to the plate of V2C via a wire, or coupler circuit (e.g., 14C), or a DC level shifting circuit (e.g., 14C). A bias circuit, 12C, supplies a DC current to the cathodes of V1C and V2C. Note that one or more cathodes from V1C and or V2C may include a feedback element (e.g., local and or global feedback element, or one or more cathode degeneration resistors or elements). Alternatively, tubes other than triodes may be used such as tubes including two or more grids.

Figure 19:
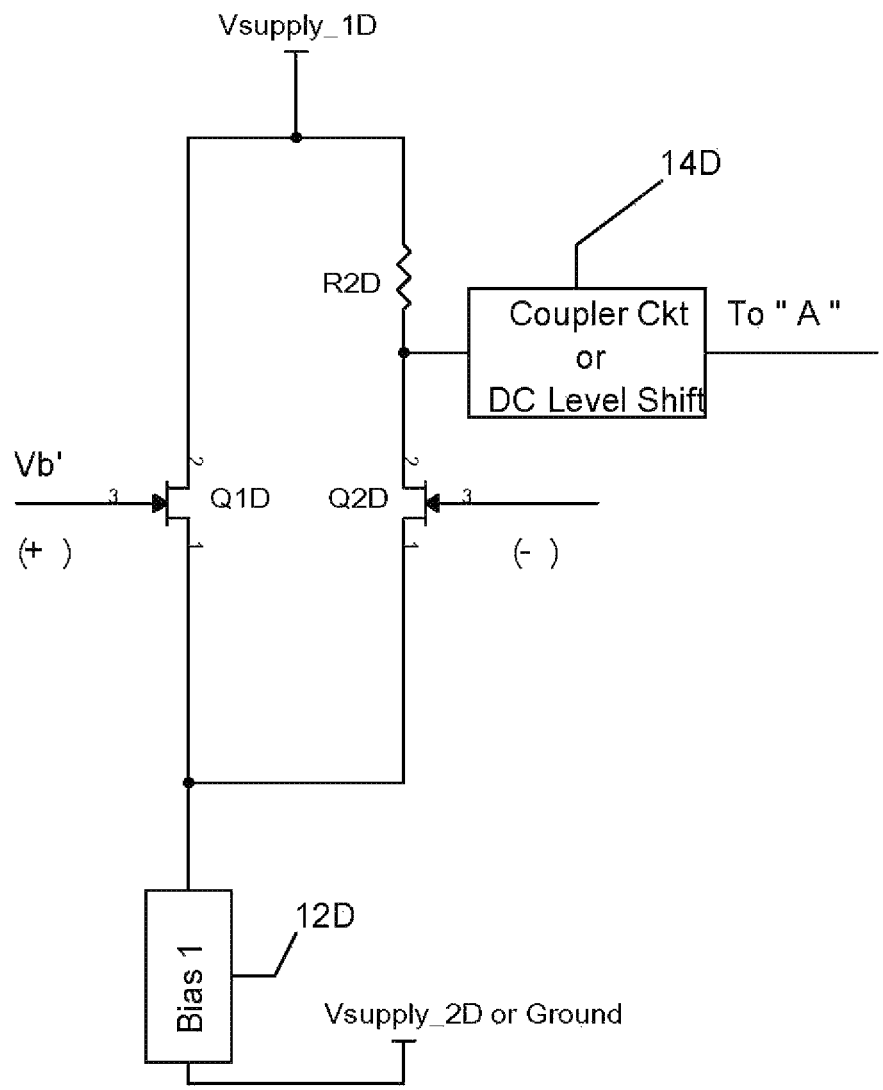
FIG. 19 shows an example FET amplifier example.

FIG. 19 shows an N Channel FET implementation of amplifier 11 that is similar to the P-Channel FET circuit in FIG. 17.

Figure 20:
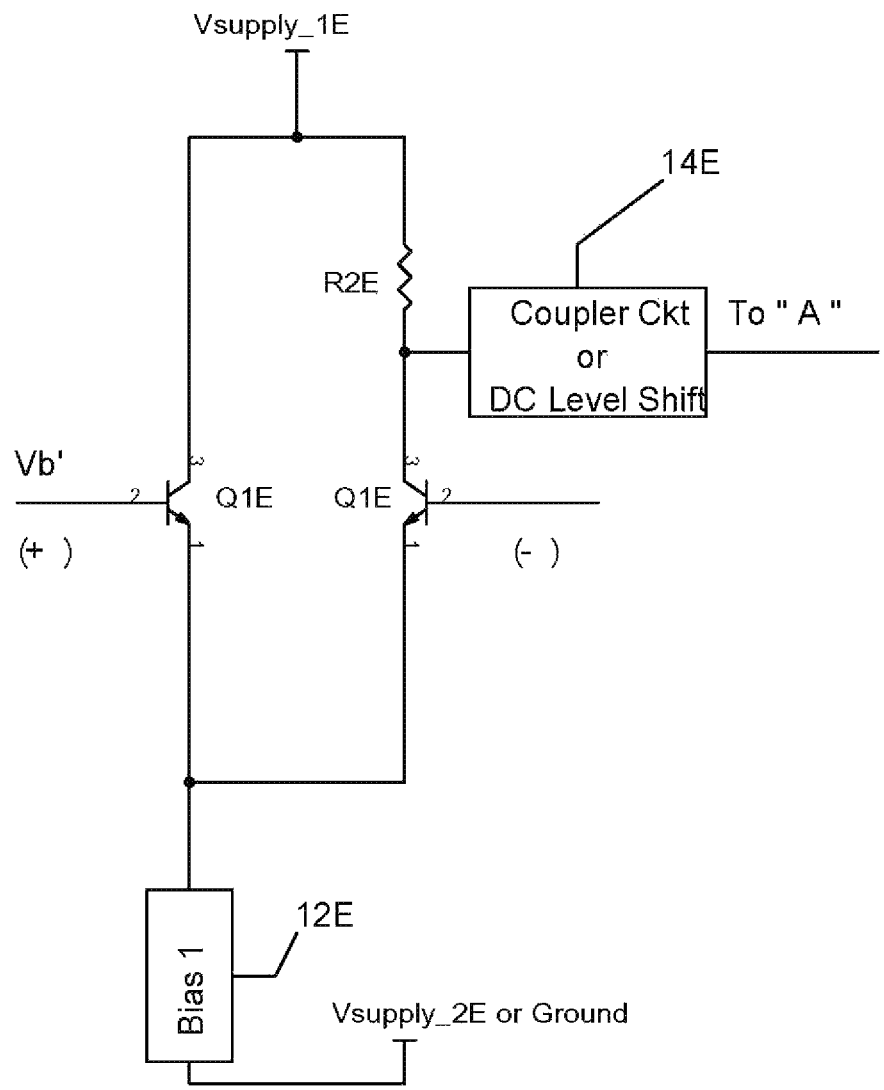
FIG. 20 shows another transistor amplifier example.

FIG. 20 shows an NPN transistor implementation of amplifier 11 that is similar to the PNP transistor circuit in FIG. 16.

Another embodiment includes tube amplifier(s) wherein the plate and or screen voltage operate(s) at zero volts or around zero volts (e.g., plate or screen voltage in the range between +6 volts and −6 volts with respect to the cathode or ground) in providing a signal output. An example amplifier is shown in FIG. 21A. Although FIG. 21A shows a pentode, it has been found that some triodes and or multi-grid tubes will provide signal output with plate and or screen voltages at near zero volt or at zero volt.

The example in FIG. 21A shows a common cathode circuit to operate at near zero or zero volt (e.g., DC voltage from plate to cathode or ground), however, other configurations are included in the embodiment such as common grid, common plate, cascode, and or differential pair. FIG. 21A shows that the cathode of V11 is coupled to an AC ground. Coupling from cathode to ground may include a resistor, capacitor, inductor, or a circuit network (e.g., including at least one active and or passive component).

Tables 8 and 9 show summaries of some discoveries or findings (e.g., including unexpected findings) when operating a tube circuit such as the one shown in FIG. 21A. Note that the tubes summarized in Table 8 are both conventional high voltage types (e.g., tubes that typically are specified for a power supply voltage of 100 volts DC or more) and also low voltage (e.g., automobile or space charge tubes that are specified at a plate voltage of 12 to 16 volts DC). Also in Tables 8 and 9 the input signal is at 200 mV peak to peak or 200 mV peak (e.g., at 1 kHz or other frequency or frequencies). The plate load resistor (e.g., RL) has values from 100KΩ to over 1MΩ. The relative gain can be calculated by the magnitude of the output signal divided by the magnitude of the input signal. Also pertaining to FIG. 21A and Table 8, the cathode resistor, Rk=100Ω, and cathode capacitor, Ck was not used or connected. Of course the cathode of the tubes may be coupled a circuit network including a resistor, capacitor, inductor, solid state device, and or other electronic component(s).

In TABLES 8 and 9 other values for the load resistor may be used. Also other voltages including the plate supply and or grid supply and or second or screen grid supply may be used.

TABLE 8

Summary of various data relating to FIG. 21.

| TUBE | Brand | Plate Supply Volts | Screen Grid Supply Volts | Vout pk-pk Volts | Notes | HD$_2$ (%) | HD$_3$ (%) |
|---|---|---|---|---|---|---|---|
| 6BA6** | RCA | 47.0 | 0.0 | 6.150 | RL < 1 MΩ | — | — |
| 6BA6** | RCA | 6.2 | 0.0 | 2.17 | RL < 1 MΩ | — | — |
| 6BA6** | RCA | 2.5 | 0.0 | 0.37 | RL < 1 MΩ Negative peak clipping | — | — |
| 6BA6** | RCA | 0.87 | 0.0 | 0.061 | RL < 1 MΩ Clean output | — | — |
| 6BA6** | RCA | 0.0 | 0.0 | 0.006 | RL < 1 MΩ Clean output | — | — |
| 6BA6** | RCA | 0.0 | 0.0 | 0.019 | RL = 1 MΩ Clean output | — | — |
| 6AU6** | GE #0 | 0.0 | 0.0 | 0.0 | RL = 1 MΩ | — | — |
| 6AU6** | MAGNAVOX | 0.0 | 0.0 | 0.046 | RL = 1 MΩ | 10.0% | 3.60% |
| 6AU6** | "TRAM" | 0.0 | 0.0 | 0.004 | RL = 1 MΩ | | |
| 6AU6** | GE #1 | 0.0 | 0.0 | 0.264 | RL = 1 MΩ | 30.0% | 7.00% |
| 6AU6** | GE #1 | 0.0 | Triode mode | 0.360 | RL = 1 MΩ Screen grid connected to plate | 5.0% | 3.0% |
| 6AU6** | GE #1 | 0.0 | Plate opened | 0.470 | RL = 1 MΩ Screen grid connected to plate resistor | — | — |
| 6AU6** | GE #2 | 0.0 | 0.0 | 0.184 | RL = 1 MΩ | 30.0% | 10.00% |
| 5749/ 6BA6** | GE | 0.0 | 0.0 | 0.070 | RL = 1 MΩ | 5.0% | 0.30% |
| 5749/ 6BA6** | GE | 0.0 | 2.0 | 0.131 | RL = 1 MΩ | 3.0% | 0.36% |

**= Conventional or high voltage tube, and — = Not measured.

Table 9 shows other results relating to FIG. 21A.

TABLE 9

Summary of various data relating to FIG. 21 A.

| TUBE | Brand | Plate Supply Volts | Screen Grid Supply Volts | Vout peak to peak Volts | Notes | HD$_2$ (%) | HD$_3$ (%) |
|---|---|---|---|---|---|---|---|
| 6AU6** | SYLVANIA | 0.0 | 3.15 | 0.23 | RL = 1 MΩ Vout ocurred peaked at screen grid = 3.15, Vout was less when screen grid voltage was <3.15 volt and slightly larger than 3.15 volts | 2.0% | 3.0% |
| 12AC6* OR 12DZ6* | WESTINGHOUSE | 0.0 | 0.0 | 0.0085 | RL = 1 MΩ Vout slight rectification, maintained correct inverted phase | — | — |
| 12AC6* OR 12DZ6* | WESTINGHOUSE | 0.0 | 4.12 | 0.0075 | RL = 1 MΩ Vout has no phase | — | — |

TABLE 9-continued

Summary of various data relating to FIG. 21 A.

| TUBE | Brand | Plate Supply Volts | Screen Grid Supply Volts | Vout peak to peak Volts | Notes | HD$_2$ (%) | HD$_3$ (%) |
|---|---|---|---|---|---|---|---|
| 12K5* | RCA | 0.0 | 23.0 | 0.0045 | inversion this is unexpected RL << 1 MΩ | 3.0% | — |

*= low voltage tube
**= high voltage tube
— = not measured

From Tables 8 and 9, some of the unexpected findings or results are:

A) High voltage and or low voltage tubes operate at plate and or screen grid voltages of zero or near zero volts. Having signal output at the plate with zero or near zero supply voltage (e.g., for the plate and or screen or second grid) is unexpected.

B) The output of the common cathode amplifier should have a normally inverted phase referenced to the input signal's phase which was observed in all the findings except with the 12AC6 or 12DZ6 tubes (TABLE 9) when the plate supply voltage was about zero or zero, and when the screen grid voltage was for example at about 4.12 volts (or other voltages may be used), which resulted in the output signal waveform at the plate to be non-inverted (e.g., the phase of the output signal at the plate was the same phase as the input signal at the control grid). Having the same phase from input to output of the (e.g., common cathode) tube circuit (e.g., grid to plate) is unexpected.

C) In TABLE 9, the Sylvania 6AU6 tube exhibited more third order harmonic distortion than second order harmonic distortion, which is unexpected (e.g., when generally the second order distortion is higher than the third order distortion).

D) In TABLE 8, another unexpected result was stated when a GE (General Electric) 6AU6 tube #1 was configured for triode mode by coupling or connecting the screen grid to the plate and operating at near zero or zero plate supply voltage, which unexpectedly provided signal output at the plate when the control grid was coupled to a signal generator. Another unexpected finding was that when the plate was left open or unconnected and the screen grid with near zero or zero screen grid supply was coupled to a load (e.g., load resistor or load network), also a signal was outputted at the screen grid. Another unexpected result was that the signal outputted from the screen grid provided more signal amplitude than when the tube was triode connected with the screen grid coupled or connected to the plate.

It should be noted that an embodiment may include when the plate was left open or unconnected (e.g., or uncoupled) and the screen grid with near zero or zero screen grid supply was coupled to a load (e.g., load resistor or load network), also signal was outputted at the screen grid, the plate may be left open or coupled to a voltage source or voltage potential. Note the voltage source may include a signal and or DC voltage.

In FIG. 21A it should be noted a that third grid (e.g., suppressor grid or another grid) may be coupled in any manner such as but not limited to being coupled to a voltage source, a ground, a cathode, another grid, or a plate. The cathode may be coupled to a signal source. Grid(s) G1 and or G2 may include a signal source and or a bias voltage.

FIG. 21B shows another embodiment wherein the operating voltage of a conventional (e.g., high voltage tube) tube and or a low voltage tube may operate at even lower voltages by forward biasing a first grid (e.g., grid to cathode voltage ≥0 volts) and applying signal to a second grid and providing an output at a third grid and or at a plate.

In FIG. 21B for tube V12, a first grid G1 is coupled to bias source, +Vbias_VG1* (e.g., +Vbias_VG1*≥0) via resistor RG1. A signal input source is couple to G2, a second grid of V12. The third grid of V12 is shown as an example to be coupled to the cathode. The cathode of V12 may be coupled to one or more components, or the cathode of V12 may be coupled to ground. For example, FIG. 21B shows a tube, V12, with its cathode coupled to resistor and or capacitor coupled to ground. The cathode of V12 may be coupled to via a network such as previously stated. A load network or resistor is coupled to the plate of V12 and the plate provides a signal output terminal. In one embodiment, the first grid includes a first DC bias voltage. The cathode may be coupled to a signal source. Grid(s) G1 and or G2 may include a signal source and or a bias voltage.

For FIG. 21B, Table 10 summarized experiments with high voltage tubes that operated with a plate supply at 12 volts or 15 volts. Note that the plate power supply is not limited to 12 volts or 15 volts, but can include plate supply voltages below 12 volts or other voltages. Vin=400 mV pk-pk (e.g., at 1 kHz) into G2 of tube V12.

TABLE 10

Experimental results related to FIG. 21B.

| TUBE | RG1 | +Vbias_VG1* | RL | Vout pk-pk volts | NOTES |
|---|---|---|---|---|---|
| 12FX5** | 1 KΩ | 11 VOLTS | 2.4 KΩ | 1.000 | |
| 12FX5** | 100 Ω | 11 VOLTS | 2.4 KΩ | See NOTES | Vout has distorted output with less output (<1.00 volt) |
| 3S4*** | 12 KΩ | 12 VOLTS | 24 KΩ | 0.800 | |

**= high voltage tube
***= portable tube radio tube that normally operates with a plate supply ≥67.5 volts.

According to an RCA tube manual (e.g., for conventional or high voltage tubes), the second grid G2 is not a signal input grid. The first grid, G1 is not to be forward biased because that is where the AC signal source is coupled to. The (e.g., conventional or non space charge or high voltage or non-automotive or non-low voltage) tubes, e.g., 12FX5 and 3S4, are required that the second grid, G2 be provided with a stable or fixed DC voltage of at least 130 volts (e.g., 12FX5) and at least 67.5 volts (e.g., 3S4) according to the RCA tube manual. Instead in an embodiment, in FIG. 21B the second grid is coupled to Vin, the input (e.g., AC) signal source, and the first grid is forward bias. Alternatively in another embodiment, the second grid may include the AC signal input source plus a second DC bias voltage. It should be noted that the first grid may include a DC bias voltage plus a second AC signal or the first grid may include a first DC bias voltage. This bias voltage or DC bias voltage may be ≥0 volts.

The 3S4 (e.g. 7 pin tube) and its associated family of tube such as the 1R5, 1S4, 1S5, 1T4, 1L4, 1U4, 1U5, 3V4, etc. and its 8 pin counterparts, 1A5, 1H5, 1N5, 1P5, 1A7, etc. have directly heated cathodes, and one or more terminals of the filament serves as a cathode connection.

It should be noted that there are some specifically manufactured automotive and low voltage tubes such as the 12DS7 space charge low voltage tetrode that utilizes connecting the first grid (e.g., closest to the cathode) with a positive voltage (e.g., the first grid is biased with a positive voltage with respect to the cathode) and the second grid connected to the input signal source. Also of note the second grid is biased at ≤0 volt DC (e.g., with respect to the cathode) that includes an AC signal input source.

The example circuit in FIG. 21B shows a method of using conventional non space charge high voltage tube to be operated with low voltages by forward biasing a control grid (e.g., providing a positive voltage across the control grid and the cathode).

The example circuit in FIG. 21B, Vin is not coupled to the first or control grid G1. Vin is coupled to a second grid (e.g., a screen grid, G2, or another grid) and Vin may have an AC signal and or a DC bias signal, wherein the DC bias signal is zero, positive, or negative in voltage.

For the circuit in FIG. 21B, other tubes may be used included conventional high voltage and or low voltage (e.g., space charge or automotive) tubes, or low voltage tubes wherein a first grid is a conventional grid that is not a spaced charge grid that is applied with a positive plate supply voltage (e.g., such as the first grid in a 12DS7 space charge automobile tetrode tube that has as its first grid, a space charge grid, wherein the plate supply voltage is connected to it, the first grid).

Figure 22B:
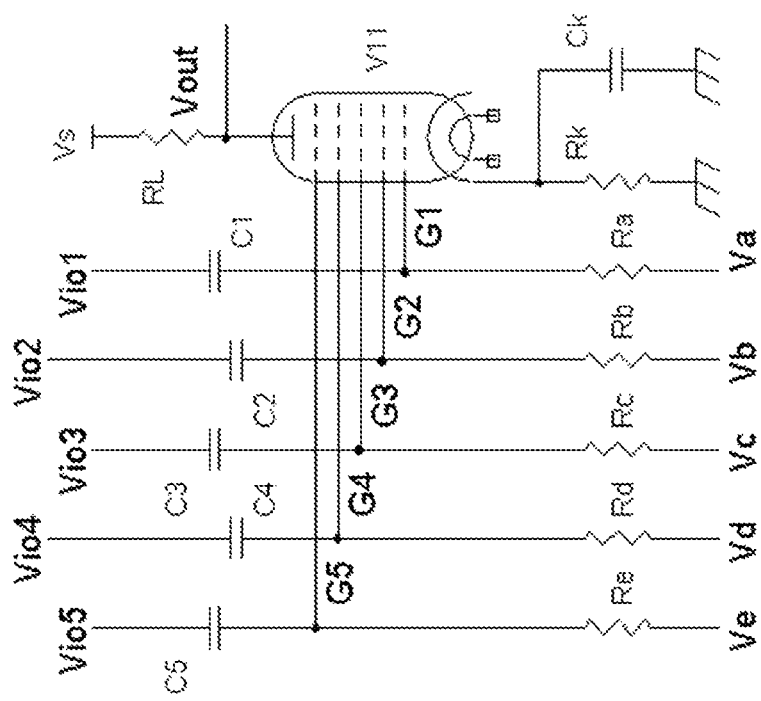
FIG. 22B show another example of a low voltage tube circuit.
Figure 22A:
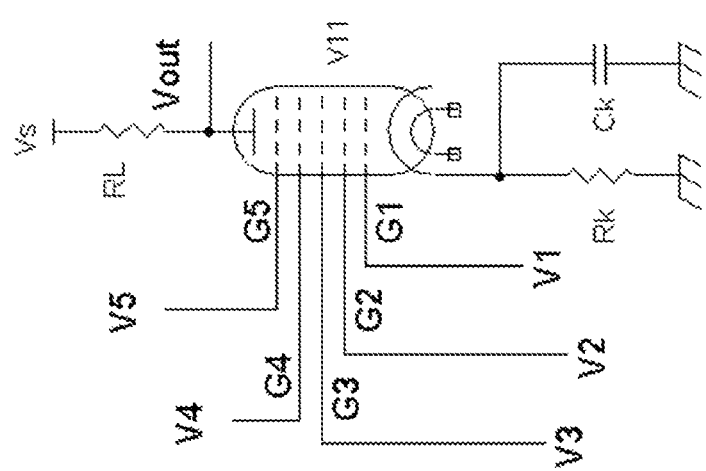
FIG. 22A shows an example of a low voltage tube circuit.

FIG. 22A shows an example low voltage tube circuit with multiple grids in tube V11. Although FIG. 22A shows five grid, the vacuum tube V11 may show N grids where N≥1. Each voltage terminals, V1, V2, V3, V4, and or V5 may include an AC signal and or a DC bias signal. The DC bias signal may be zero, negative, or positive in voltage. The supply voltage Vs is a voltage ≥0 volt and or the voltage may be lower than the recommended voltage as suggested by a data sheet for that particular tube. The tube V11 may include conventional, high voltage, non space charge, non-automotive, and or low voltage (e.g., space charge or automotive) tube type(s).

Voltage terminals, V1, V2, V3, V4, and or V5 may be provided as input or output terminals. For example if G1 is biased with a positive voltage via bias circuit (e.g., a resistor or element coupled to positive DC bias voltage) and G2 is coupled to an input AC signal that may or may not include a DC bias voltage (e.g., DC bias voltage can be zero, negative, or positive in voltage), the output signal(s) may be taken at the plate (e.g., Vout) and or any of the other grids such as G1, G3, G4, and or G5. FIG. 22A shows a general circuit example, which allows any of the grids (e.g., G1, G3, G4, and or G5) may be coupled or connected to each other, and or allows any of the grids (e.g., G1, G3, G4, and or G5) may be connected or coupled to the plate.

For example, if N=1, V11 is a triode and a lower voltage operation on the plate supply voltage is provided by having V1 as an input signal with a positive DC bias voltage added to an AC signal voltage.

In FIG. 22A the cathode of V11 is showed to be coupled to an AC ground or ground via resistor Rk and or capacitor Ck. Alternatively, the cathode of V11 may be coupled to another circuit or to a signal source. This circuit may include any combination of capacitor, resistor, inductor, active circuit device, circuit, another device, semiconductor, vacuum tube, amplifier, oscillator, and or the similar devices or circuits.

In FIG. 22A example plate supply voltage Vs may be below zero, zero, or above zero. It has been found that AC output signals were outputted when the supply voltage Vs is below zero, zero, or above zero. The heater or filament of tube V11 is provided with an appropriate voltage. Note that tube V11 may include conventional high voltage and or low voltage (e.g., space charge or automotive) tubes.

FIG. 22B shows another embodiment. Input or output terminals, Vio1, Vio2, Vio3, Vio4, and or Vio5 can be used to couple a signal into the respective grids or can be used as one or more signal output terminal(s). Plate supply voltage Vs may be below zero, zero, or above zero. The heater or filament of tube V11 is provided with the appropriate voltage. Again, FIG. 22B is illustrative in showing five grids, but in general the circuit in FIG. 22B applies to a tube with N grid(s) where N≥1.

A summary of example experiments is shown in TABLE 11. Note that other tubes may be used included conventional high voltage and or low voltage (e.g., space charge or automotive) tubes.

For FIG. 22B TABLE 11, Vs=+12 volts and cathode is grounded and all tubes are pentagrid tubes. However, other tubes with different number of grids can be used. It should be noted that different values of supply voltage(s), capacitor(s), and or resistors may be used. As an example, capacitors C1, C2, C3, C4, and C5 provide a low Z (or AC short circuit) or low impedance.

TABLE 11

| TUBE | Ra | Va | RL | Gain | NOTES |
|------|------|----------|------|---------|------------|
| 7A8** | 3.0 KΩ | 12 VOLTS | 3.0 KΩ | >1.0 | SEE NOTE 1 |
| 6BE6** | 3.0 KΩ | 12 VOLTS | 22 KΩ | >1.0 | SEE NOTE 2 |
| 1R5*** | 22 KΩ | 12 VOLTS | 22 KΩ | ~1 & >1 | SEE NOTE 3 |

**= high voltage tube
***= portable tube radio tube that normally operates with a plate supply ≥67.5 volts.

NOTE 1 for TABLE 11 (e.g, 7A8): A +12 volt bias voltage is coupled to grids G3 and G5 (e.g., Vc=Ve=+12 v, Rc=Re=0Ω, but other resistance values could be used). The AC signal is fed to Vio2 and Vio4 with Vb=Vd=0 volt, and Rb=Rd=22KΩ (but other resistance values can be used).

NOTE 2 (e.g., 6BE6): Grid G5 is internally connected to the cathode and neither C5 nor Re is present in the circuit and Ve is disconnected. Grids G4 and G2 are internally connected. With equivalently, Rb=Rd=44KΩ and Vb=Vd=+12 volts DC, and with input signal Vin1=Vio3 and Rc=22KΩ, |Vout/Vin1|=0.26, where Vout is at the plate or at RL. An output signal was observed at G4 and G2, which are internally connected in this tube. The output voltage is the same at Vio2 and at Vio4, which serve as output terminals. The gain |Vio2/Vin1|=0.006.

In NOTE 2 with the 6BE6 tube, more gain was observed when the input signal was applied to grid 4 and to grid 2. The input signal is defined as Vin2=Vio2=Vio4. Gain=|Vout/Vin2|=4. Almost the same gain was observed when the third grid, G3 was used as an output terminal, Vio3, which resulted in a gain=|Vio3/Vin2|=3.86. It should be noted that the control grid, G1, which is biased via Va=+12 volts DC and Ra=3KΩ also provided an output signal at Vio1 (e.g., this is unexpected). One aspect of forward biasing the grid or to provide a positive grid to cathode voltage along with an input signal is that higher gain is provided as compared to zero or negative bias between a grid and cathode.

For NOTE 3 (e.g., 1R5), grid G5 is internally connected to one of the filament's terminal at pin 1 of the 7 pin tube. Also grids G2 and G4 are internally connected. Effectively, Rb=Rd=44KΩ (but other resistance values may be used) with Vb=Vd=+12 volts DC. Also for grid, G3, Vc=+12 volts DC, Rc=22KΩ. With an input signal Vin1=Vio2=Vio4, gain=|Vout/Vin1|=0.98~1. Grid, G3 can be used as an output terminal and gain=|Vio3/Vin1|=1.34, which provides more gain than when the output signal was taken at the plate via Vout. Alternatively to increase signal at the plate, the input signal may be coupled to G2, G4, and G3.

Note in FIG. 22B that voltage value(s) for Va, Vb, Vc, Vd, and or Ve may include other voltage values (e.g., other than +12 volts or zero volt).

FIGS. 23A, 23B, 23C, and 23D show examples of low plate supply tube circuits. The plate supply may include zero volts, a lower than recommend positive voltage, near zero volts, or a slight negative plate supply voltage. An example plate supply voltage may refer to a voltage with respect to ground or to a cathode of a tube. Although FIGS. 23A, 23B, 23C, and 23D show examples of tetrodes, the tubes may include pentodes or tube with more than two grids (e.g., a three, four, five, or six grid tube).

Figures 23A, 23B, 23C, 23D:
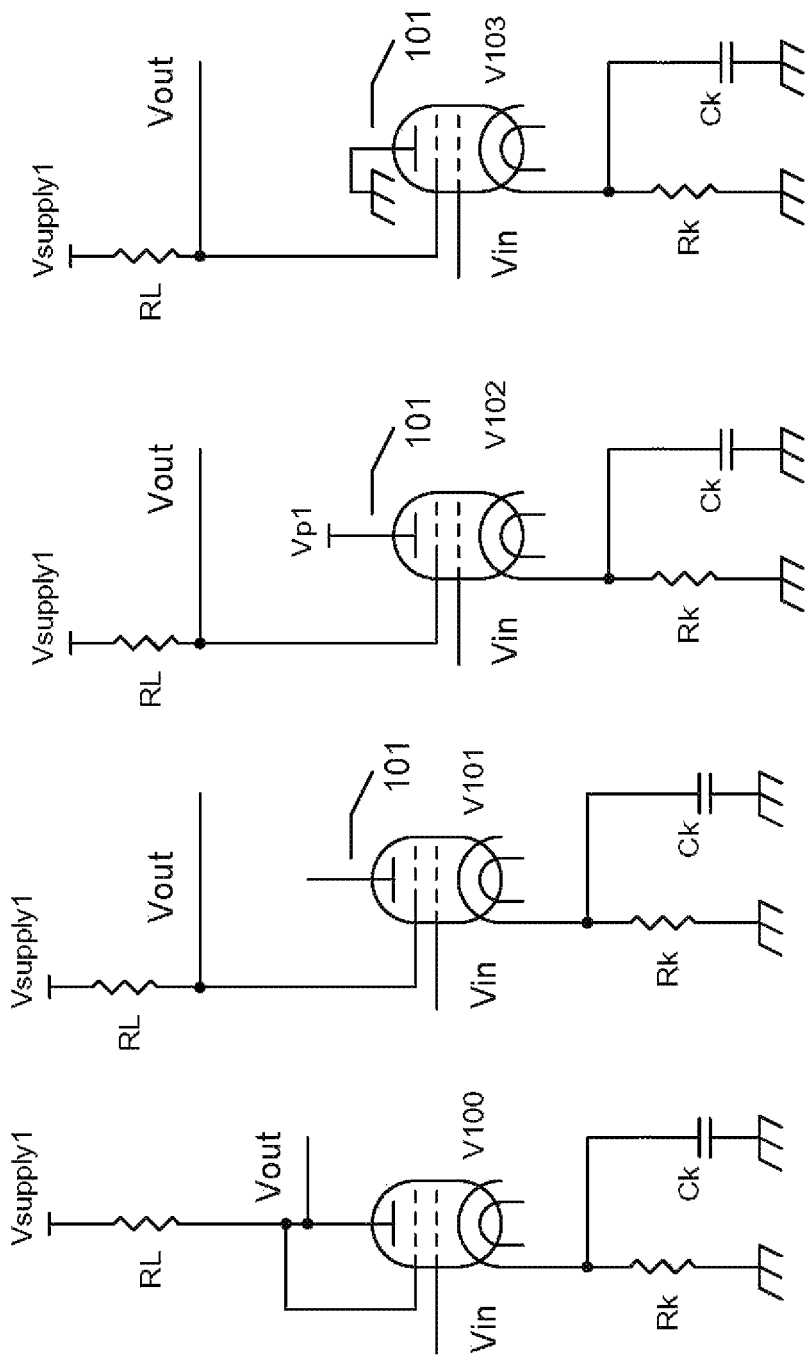
FIGS. 23A, 23B, 23C, and 23D show alternate examples of low to very low voltage tube circuits.

FIG. 23A shows a triode connected tube with the second grid for example is coupled to the plate.

FIG. 23B shows the second grid utilized to provide signal output via load resistor (or a load network) wherein the plate, 101, is left floating, unconnected, or coupled via a resistor (or other component) to a voltage source, signal source, or ground.

FIG. 23C shows the second grid utilized to provide signal output via load resistor (or a load network) wherein the plate, 101, is coupled to a voltage source Vp1.

FIG. 23D shows the second grid utilized to provide signal output via load resistor (or a load network) wherein the plate, 101, is coupled to ground or (e.g., alternatively) to a potential.

Note that a signal source and or bias voltage may be coupled to the cathode of any of the circuits previously mentioned including (e.g., but not limited to) any of circuits in FIGS. 21A, 21B, 23A, 23B, 23C, and or 23D.

Note that a signal source and or bias voltage may be coupled to one or more grid(s) of any of the circuits previously mentioned including (e.g., but not limited to) any of circuits in FIGS. 21A, 21B, 23A, 23B, 23C, and or 23D.

Embodiments may include the following (e.g, but not limited to):

1) A low voltage tube circuit using a vacuum tube comprising: the vacuum tube including at least a cathode or heater terminal, a plate terminal, and at least a first grid terminal, a plate power supply; a load element which includes first and second terminals; coupling the cathode of the vacuum tube to ground, AC ground, or a voltage source; coupling the first terminal of a load element to the plate of the high voltage conventional vacuum tube, coupling a voltage source to the second terminal of the load element; coupling a first input signal to the first grid or to the cathode of the vacuum tube, wherein an output signal is provided at the plate of the vacuum tube when the plate power supply is provided at zero volt or nearly zero volts with respect to the cathode of the vacuum tube. The low voltage circuit may include: The low voltage tube circuit wherein the vacuum tube includes a one or more extra grids, and wherein one or more extra grids is coupled to the plate of the high voltage conventional vacuum tube; or wherein the more extra grids is coupled to a voltage source and or signal source which may include wherein the input signal coupled to the first grid includes an AC signal and or a DC bias signal or wherein the vacuum tube includes at least a second grid and wherein in the second grid is supplied with a positive voltage; or wherein the vacuum tube includes at least a second grid and wherein in the second grid is supplied with a voltage close to zero volts; or wherein the vacuum tube is a conventional high voltage tube or wherein the vacuum tube is a low voltage vacuum tube that includes a space charge vacuum tube or a low voltage automobile vacuum tube or wherein the second grid supplies an output signal. 2) A low voltage tube circuit using a conventional high vacuum tube comprising the conventional high voltage vacuum tube including at least a cathode or heater terminal, a plate terminal, and first grid terminal and second grid terminal, a plate power supply, a load element which includes a first terminal and a second terminal, coupling the cathode of the vacuum tube to ground, AC ground, or a voltage source, coupling the first terminal of a load element to the plate of the high voltage conventional vacuum tube, coupling the plate power supply to the second terminal of the load element, coupling a first input signal to the first grid or to the cathode of the vacuum tube, coupling a lower than normal direct current voltage to the second grid, wherein lower than normal voltage is below the recommended voltage stated in a data sheet for the conventional high voltage vacuum tube. This low voltage tube circuit may include wherein the conventional high voltage vacuum tube includes a third, fourth, fifth, or sixth grid, and wherein the input signal is coupled to the third, fourth, fifth, or sixth grid; wherein a bias voltage is added or coupled to the a third, fourth, fifth, or sixth grid; or wherein the plate is decoupled from the load element or wherein the plate is coupled to ground, and wherein the second grid provides an output signal; or wherein the plate power supply includes a voltage that is lower that is recommended in the data sheet of the conventional high voltage tube. 3) A low voltage tube circuit using a (e.g., conventional high voltage) vacuum tube comprising the conventional high voltage vacuum tube comprising at least a cathode or heater terminal, a plate terminal, and first grid terminal and second grid terminal, a plate power supply, a load element which includes first and second terminals, coupling the cathode of the vacuum tube to ground, AC ground, or a voltage source, coupling the first terminal of a load element to the plate of the high voltage conventional vacuum tube, coupling the plate power supply to the second terminal of the load element, coupling a forward or positive bias voltage source to the first grid of the vacuum tube, coupling an input signal to the second or to the cathode of the vacuum tube, wherein an output signal is provided at the plate of the vacuum tube when the plate power supply is lower than a normal operating voltage and, wherein the forward or positive bias voltage to the first grid provides for operating at the lower than normal plate supply voltage which is below the recommended voltage stated in a data sheet for the conventional high voltage vacuum tube. The low voltage tube circuit may include The low voltage tube circuit may include further providing an output signal at the first grid via coupling the first grid with the bias voltage coupled to a resistor or to a circuit element, or further comprising a third, fourth, or Nth grid, wherein the input signal is coupled any combination of grids, or wherein any of the grids may provide one or more grid output signal or wherein any of the grids may include one or more grid bias voltage or, wherein any combination of at least one grid and or cathode provides an input or output terminal, or wherein any combination of grids may include a positive or forward bias voltage and or a signal voltage. Also it should be noted that in FIG. 21A and or 21B, capacitor(s) C5 may be coupled to the cathode and ground; and for FIGS. 22A, 22B, 23A, 23B, 23C, and or 23D, capacitor(s) Ck may be coupled to the cathode and ground.

This disclosure is illustrative and not limiting; further modifications will be apparent to one skilled in the art and are intended to fall within the scope of the appended claims and or of the embodiments described.

That which is claimed is:

1. A low voltage tube amplifier circuit using a vacuum tube comprising:
    the vacuum tube including a cathode terminal, a plate terminal, and a first grid including a first grid terminal, wherein the vacuum tube normally operates at a plate voltage of at least +12 volts;
    an input terminal of the low voltage tube amplifier circuit that is coupled to the first grid terminal of the vacuum tube;
    an output terminal of the low voltage tube amplifier circuit that is coupled to the plate terminal of the vacuum tube;
    a plate power supply whose voltage is at zero volt or nearly zero volts with respect to the cathode terminal of the vacuum tube;
    a load element which includes a first terminal and a second terminal;
    coupling the cathode terminal of the vacuum tube to ground;
    coupling the first terminal of the load element to the plate terminal of the vacuum tube;
    coupling the plate power supply to the second terminal of the load element;
    wherein coupling a first input signal to the first grid terminal of the vacuum tube provides an output signal at the plate terminal of the vacuum tube;
    wherein the output signal is provided at the plate terminal of the vacuum tube when the plate power supply is provided at zero volt or nearly zero volts with respect to the cathode terminal of the vacuum tube.

2. The low voltage tube amplifier circuit of claim 1 wherein the vacuum tube includes a second grid that includes a second grid terminal.

3. The low voltage tube amplifier circuit of claim 1 wherein the input signal coupled to the first grid terminal includes an AC signal and a DC bias signal.

4. The low voltage tube amplifier circuit of claim 2 wherein the second grid terminal is supplied with a first positive voltage source.

5. The low voltage tube amplifier circuit of claim 2 wherein the second grid terminal is supplied with a voltage close to zero volts.

6. The low voltage tube amplifier circuit of claim 1 wherein the vacuum tube includes a conventional high voltage tube that normally operates at the plate voltage of over 100 volts.

7. The low voltage tube amplifier circuit of claim 1 wherein the vacuum tube includes a space charge vacuum tube or a low voltage automobile vacuum tube.

8. The low voltage tube amplifier circuit of claim 4 wherein the second grid terminal is coupled to a first terminal of a second load resistor and a second terminal of the second load resistor is coupled to the first positive voltage source and wherein the second grid terminal supplies a second output signal.

9. A low voltage tube circuit using a conventional high voltage vacuum tube comprising:
    the conventional high voltage vacuum tube including at least a cathode or heater terminal, a plate terminal, and a first grid terminal G1 and a second grid terminal G2;
    a plate power supply;
    the conventional high voltage vacuum tube normally operates with the plate power supply whose voltage is greater than 100 volts;
    setting the plate power supply voltage to zero volt or near zero volts;
    a load element which includes a first terminal and a second terminal;
    coupling the cathode of the vacuum tube to ground;
    coupling the first terminal of the load element to the plate terminal of the high voltage conventional vacuum tube;
    coupling the plate power supply to the second terminal of the load element;
    further comprising that the low voltage tube circuit includes an input terminal that is coupled to the first grid terminal of the conventional high voltage vacuum tube;
    further comprising that the low voltage tube circuit includes an output terminal that is coupled to the plate terminal of the conventional high voltage vacuum tube;
    coupling a second grid voltage source that includes zero volt or nearly zero volts to the second grid terminal G2;
    wherein coupling a first signal source to the first grid terminal provides an output signal at the output terminal.

10. The low voltage tube circuit of claim 9 wherein the conventional high voltage vacuum tube includes a third grid terminal G3, fourth grid terminal G4, or fifth grid terminal G5, and wherein the first input signal is coupled to the third grid terminal G3, or fourth grid terminal G4, or fifth grid terminal G5.

11. The low voltage tube circuit of claim 9 wherein a bias voltage is added to the third grid terminal G3, fourth grid terminal G4, or fifth grid terminal G5.

12. The low voltage tube circuit of claim 9 wherein the plate terminal is disconnected from the load element and wherein the second grid terminal provides an output signal.

13. The low voltage tube circuit of claim 9 wherein the plate power supply includes a voltage of zero volt or nearly zero volts that is lower than a recommended plate terminal voltage in a data sheet of the conventional high voltage tube.

14. A low voltage tube circuit using a vacuum tube comprising:
    the vacuum tube comprising at least a cathode including a cathode terminal, a plate including a plate terminal, a first grid including a first grid terminal and a second grid including a second grid terminal wherein the first grid is closest to the cathode and the second grid is further away from the first grid when the cathode is defined as a center reference;
    a plate power supply that includes a voltage of zero or a voltage of nearly zero volts;

further comprising a load element which includes a first terminal and a second terminal;
coupling the cathode terminal of the vacuum tube to a ground terminal;
coupling the first terminal of the load element to the plate terminal of the vacuum tube;
coupling the plate power supply to the second terminal of the load element;
coupling a first positive bias voltage source to the first grid terminal of the vacuum tube;
wherein an output signal is provided at the plate terminal of the vacuum tube when an input signal is coupled to the second grid terminal.

* * * * *